United States Patent
Hasunuma et al.

(10) Patent No.: US 7,285,859 B2
(45) Date of Patent: Oct. 23, 2007

(54) SEMICONDUCTOR DEVICE

(75) Inventors: Masahiko Hasunuma, Yokohama (JP); Sachiyo Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 11/244,140

(22) Filed: Oct. 6, 2005

(65) Prior Publication Data
US 2007/0007618 A1    Jan. 11, 2007

(30) Foreign Application Priority Data
Jul. 7, 2005    (JP)    ............... 2005-198967

(51) Int. Cl.
*H01L 23/52* (2006.01)
*H01L 29/40* (2006.01)

(52) U.S. Cl. ...................... 257/758; 257/774

(58) Field of Classification Search ................ 438/668, 438/672, 675, 700; 257/621, 752, 758, 774, 257/E21.627, E21.641, E21.575–E21.597, 257/E51.019, E51.021
See application file for complete search history.

(56) References Cited
U.S. PATENT DOCUMENTS
2004/0113238 A1    6/2004    Hasunuma et al.

2005/0167842 A1    8/2005    Nakamura et al.

FOREIGN PATENT DOCUMENTS
JP    2004-119969    4/2004

OTHER PUBLICATIONS
Hasunuma, M. et al., "Semiconductor Device," U.S. Appl. No. 11/168,928, filed Jun. 29, 2005.

*Primary Examiner*—Calvin Lee
(74) *Attorney, Agent, or Firm*—Finnegan, Henderson, Farabow, Garrett & Dunner, L.L.P.

(57) ABSTRACT

There is disclosed a semiconductor device comprising a plurality of inter-level dielectric films which are stacked and provided in plural layers above a substrate, at least one first conductor which is provided in at least one inter-level dielectric film of the stacked inter-level dielectric films, and a plurality of second conductors which are provided in the inter-level dielectric film in which the first conductor is provided and which are connected to the lower surface of the first conductor and which are extended along the downward direction from the first conductor and further extended along a first direction and a second direction perpendicular to the first direction in such a manner as to be spaced apart from each other to form a lattice shape.

20 Claims, 17 Drawing Sheets

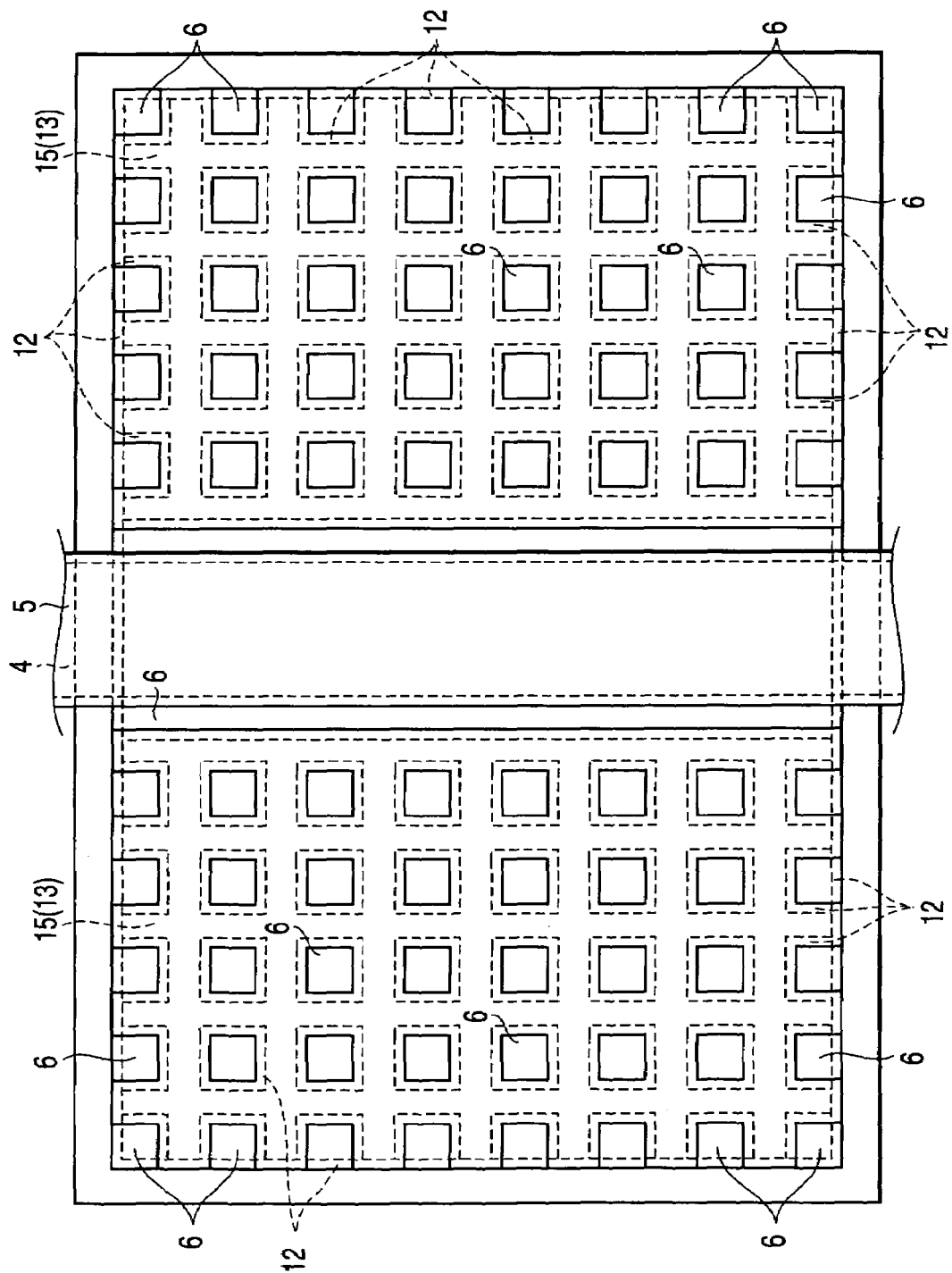
F I G. 11

SEMICONDUCTOR DEVICE

CROSS-REFERENCE TO RELATED APPLICATIONS

This application is based upon and claims the benefit of priority from prior Japanese Patent Application No. 2005-198967, filed Jul. 7, 2005, the entire contents of which are incorporated herein by reference.

BACKGROUND OF THE INVENTION

1. Field of the Invention

The present invention relates to a semiconductor device and, more particular, to a technique that increases reliability of a semiconductor device including an inter-level dielectric film made of a low dielectric constant dielectric film.

2. Description of the Related Art

In recent years, application of a so-called low dielectric constant dielectric film (Low-k film) having a dielectric constant lower than a commonly-used dielectric film and serving as a material of an inter-level dielectric film of a semiconductor device is proceeding in order to speed up the operation speed of the semiconductor device. The low-k film is obtained by, for example, reducing the density of a material to become a dielectric film, or removing polarity of a material to become a dielectric film. In the case of reducing the density (film density) of a material to become a dielectric film, a porous material is used in general. Therefore, in the low-k film, etching gas used at the time of forming a via hole or wiring groove in the film after formation of the dielectric film or moisture while the dielectric film being left to stand under the atmosphere penetrates into the film more easily as compared to a commonly-used dielectric film. Further, in the low-k film, deterioration (delamination and/or fracture) of a film material due to influence of working process is generated in the inside of the film more easily as compared to a commonly-used dielectric film.

As a result, the mechanical strength of a material itself is deteriorated (decreased) in the low-k film more than in a commonly-used dielectric film. Further, in so-called a low-k inter-level dielectric film obtained by stacking a plurality of low-k films, the bonding strength is deteriorated (decreased) at the interface between stacked low-k films or at the interface between the low-k film and other dielectric film is deteriorated (decreased) more than at the interface between commonly used dielectric films. The deterioration in the mechanical strength of the low-k film and the deterioration in the bonding strength at the interface between the low-k films or at the interface between the low-k film and other dielectric film pose a serious problem in implementing multilayer wiring structure in a semiconductor device as follows.

In order to solve the above deterioration in the mechanical strength (e.g. delamination and/or fracture) due to the use of the low-k film, a predetermined interface processing technique is applied, for example, in the formation process of the low-k film. Alternatively, when an RIE is performed to form a via hole or wring groove in the low-k film, its process is optimized. While the above measures can improve the mechanical strength of the low-k film and the bonding strength at the interface between the low-k films or between the low-k film and other dielectric film, a technique for further increasing the mechanical and bonding strength has now been demanded.

BRIEF SUMMARY OF THE INVENTION

According to an aspect of the invention, there is provided a semiconductor device comprising: a plurality of inter-level dielectric films which are stacked and provided in plural layers above a substrate; at least one first conductor which is provided in at least one inter-level dielectric film of the stacked inter-level dielectric films; and a plurality of second conductors which are provided in the inter-level dielectric film in which the first conductor is provided and which are connected to the lower surface of the first conductor and which are extended along the downward direction from the first conductor and further extended along a first direction and a second direction perpendicular to the first direction in such a manner as to be spaced apart from each other to form a lattice shape.

According to another aspect of the invention, there is provided a semiconductor device comprising: a plurality of inter-level dielectric films which are stacked and provided in plural layers above a substrate; at least one lower layer conductor which is provided as a part of a conductive passage in at least one lower inter-level dielectric film of the stacked inter-level dielectric films; and at least one first conductor which is provided at the position above and substantially overlapping the lower layer conductor and the lower inter-level dielectric film in which the lower layer conductor is provided in such a manner as to pass through an inter-level dielectric film above the lower inter-level dielectric film in which the lower layer conductor is provided along the film thickness direction thereof and which is electrically connected to the lower layer conductor to serve as a part of the conductive passage.

According to yet another aspect of the invention, there is provided a semiconductor device comprising: a plurality of inter-level dielectric films which are stacked and provided in plural layers above a substrate; at least one lower layer conductor which is provided in at least one lower inter-level dielectric film of the stacked inter-level dielectric films; and at least one first conductor which is electrically unconnected to the lower layer conductor and which is provided in the lower inter-level dielectric film above the inter-level dielectric film in which the lower layer conductor is provided at the position above the lower layer conductor and overlapping the lower layer conductor partly, at least a part of the first conductor having a smaller line width at the position off the area above the lower layer conductor and, at this position, passing through the inter-level dielectric film above the lower inter-level dielectric film in which the lower layer conductor is provided along the film thickness direction thereof.

According to still another aspect of the invention, there is provided a semiconductor device comprising: a plurality of inter-level dielectric films which are stacked and provided in plural layers above a substrate; at least one lower layer conductor which is provided in at least one lower inter-level dielectric film of the stacked inter-level dielectric films; and at least one first conductor which is electrically unconnected to the lower layer conductor and which has first and second current application portions provided in such a manner as to pass through a middle inter-level dielectric film above the lower inter-level dielectric film in which the lower layer conductor is provided along the film thickness direction thereof and sandwich the position above and overlapping the lower layer conductor, the first and second current application portions being electrically connected to each other to serve as a part of a conductive passage; and at least one upper layer conductor which is provided in such a manner as to pass through an upper inter-level dielectric film above the middle inter-level dielectric film in which the first and second current application portions of the first conductor are provided along the film thickness direction thereof at the position above and overlapping the lower layer conductor and which is electrically connected to the first and second current application portions of the first conductor to serve as a part of the conductive passage.

BRIEF DESCRIPTION OF THE SEVERAL VIEWS OF THE DRAWING

FIG. 11 is a plan view showing a process of manufacturing a semiconductor device according to the first embodiment;

DETAILED DESCRIPTION OF THE INVENTION

Hereinafter, embodiments of the present invention will be described with reference to the accompanying drawings.

First Embodiment

Firstly, a first embodiment of the present invention will be described with reference to FIGS. 1 to 14. FIG. 14 is a plan view showing a semiconductor device according to the first embodiment, and FIGS. 1 to 13 show a manufacturing process of a semiconductor device according to this embodiment.

In the first embodiment, a configuration in which sacrificial via plugs to which a current is not supplied actually are provided in succession, on a layer including a lower-side via plug of so-called a broad wiring, along two directions: along the longitudinal direction of the broad wiring and along the direction substantially perpendicular to the longitudinal direction thereof to thereby increase the mechanical strength of the area of the broad wiring will be described. Hereinafter, detailed description will be made.

Figure 1:
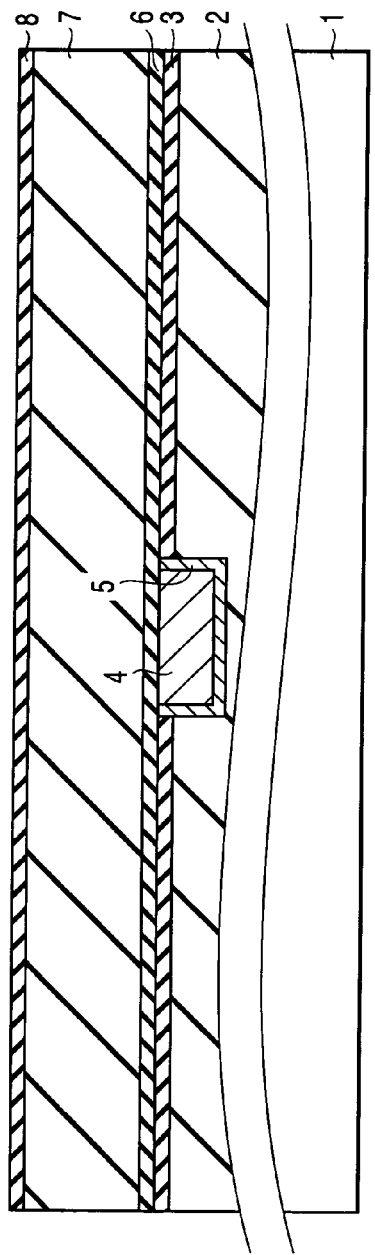
FIG. 1 is a cross-sectional view showing a process of manufacturing a semiconductor device according to a first embodiment.

Firstly, as shown in FIG. 1, an inter-level dielectric film (ILD) 2 in the (n−1)-th (n is a natural number of 2 or more) layer is formed above a silicon substrate (semiconductor substrate) including a not-shown active region. As the inter-level dielectric film 2, a so-called low dielectric constant dielectric film (low-k film) having a relative dielectric constant not more than about 3.4 is used. Examples of such a low-k film 2 include MSQ of SIOC composition (Methyl-Polysiloxane)-based low-k film and PAE (polyarylene ether) based low-k film. In the first embodiment, a PAE-based low-k film 2 having a Young's modulus of about 5 GPa and a linear expansion coefficient of about 40 ppm is used as the inter-level dielectric film 2. The inter-level dielectric film 2 is also referred to as low-k inter-level dielectric film 2. Using, for example, a CVD method, a low-k inter-level dielectric film 2 of about 300 nm in film thickness is formed.

Subsequently, a capping layer (capping film) 3 in the (n−1)-th layer is formed on the surface of the low-k inter-level dielectric film 2 in the (n−1)-th layer. In the first embodiment, a d-TEOS film is used as the capping layer 3. Using, for example, a CVD method, the d-TEOS film 3 is deposited on the low-k inter-level dielectric film 2 so as to make the film thickness thereof about 50 nm. The d-TEOS film 3 has a mechanical strength (Young's modulus) of about 30 GPa or more. Subsequently, a lower layer wiring 4 serving as a lower layer conductor and barrier metal film 5 are formed inside the low-k inter-level dielectric film 2 and d-TEOS film 3 using an embedding method. The lower layer wiring 4 receives a current supply and serves as an effective wiring constituting a predetermined conductive passage. The lower layer wiring 4 is made of, for example, Cu. The barrier metal film 5 is made of, for example, Ta. After that, a top barrier layer (top barrier film) 6 in the (n−1)-th layer is formed on the surface of the d-TEOS film 3 in such a manner as to cover the lower layer Cu wiring 4 and Ta film 5. In the first embodiment, an SiCN film is used as the top barrier layer 6. Using, for example, a CVD method, the SiCN film 6 is deposited on the d-TEOS film 3 so as to make the film thickness thereof about 50 nm. The SiCN film 6 has a mechanical strength (Young's modulus) of about 30 GPa or more. Together with the d-TEOS film 3, the SiCN film 6 serves as a stiffening member for a second conductor 15 to be described later.

Subsequently, a low-k inter-level dielectric film 7 in the n-th layer and d-TEOS film (capping film) 8 in the n-th layer are sequentially stacked on the surface of the SiCN film 6 in the (n−1)-th layer. Using the same method as in the case of forming the low-k inter-level dielectric film 2 in the (n−1)-th layer, the low-k inter-level dielectric film 7 in the n-th layer is deposited on the SiCN film 6 so as to make the film thickness thereof about 300 nm. Further, using the same method as in the case of forming the d-TEOS film 3 in the (n−1)-th layer, the d-TEOS film 8 in the n-th layer is deposited on the low-k inter-level dielectric film 7 so as to make the film thickness thereof about 50 nm.

Figure 2:
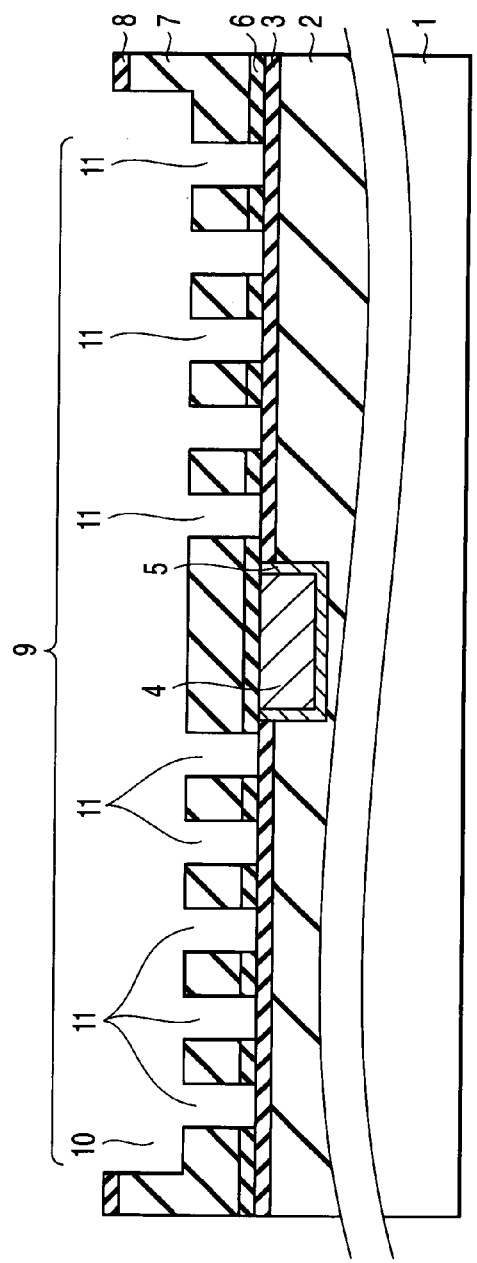
FIG. 2 is a cross-sectional view showing a process of manufacturing a semiconductor device according to the first embodiment.
Figure 3:
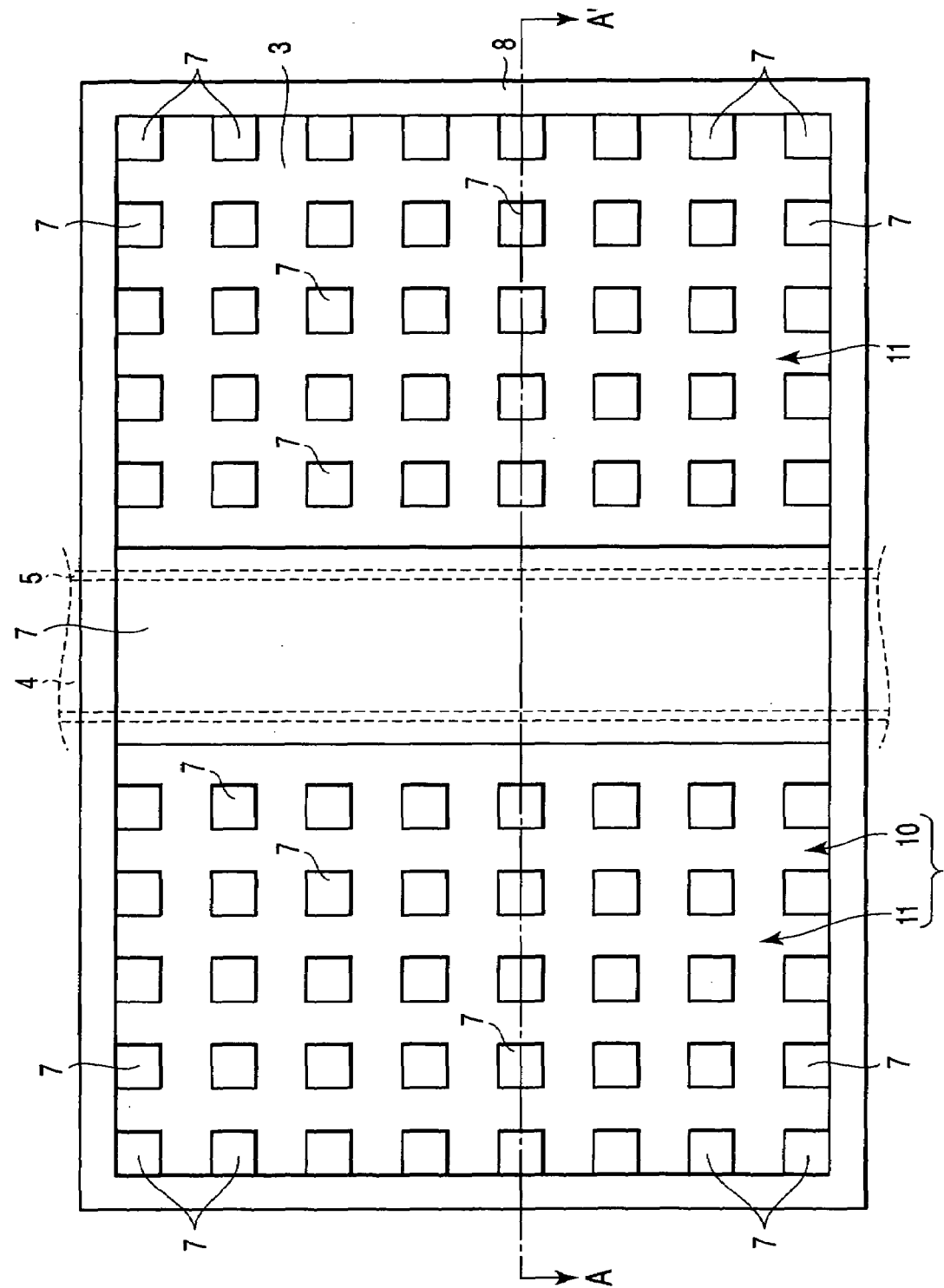
FIG. 3 is a plan view showing a process of manufacturing a semiconductor device according to the first embodiment.
Figure 4:
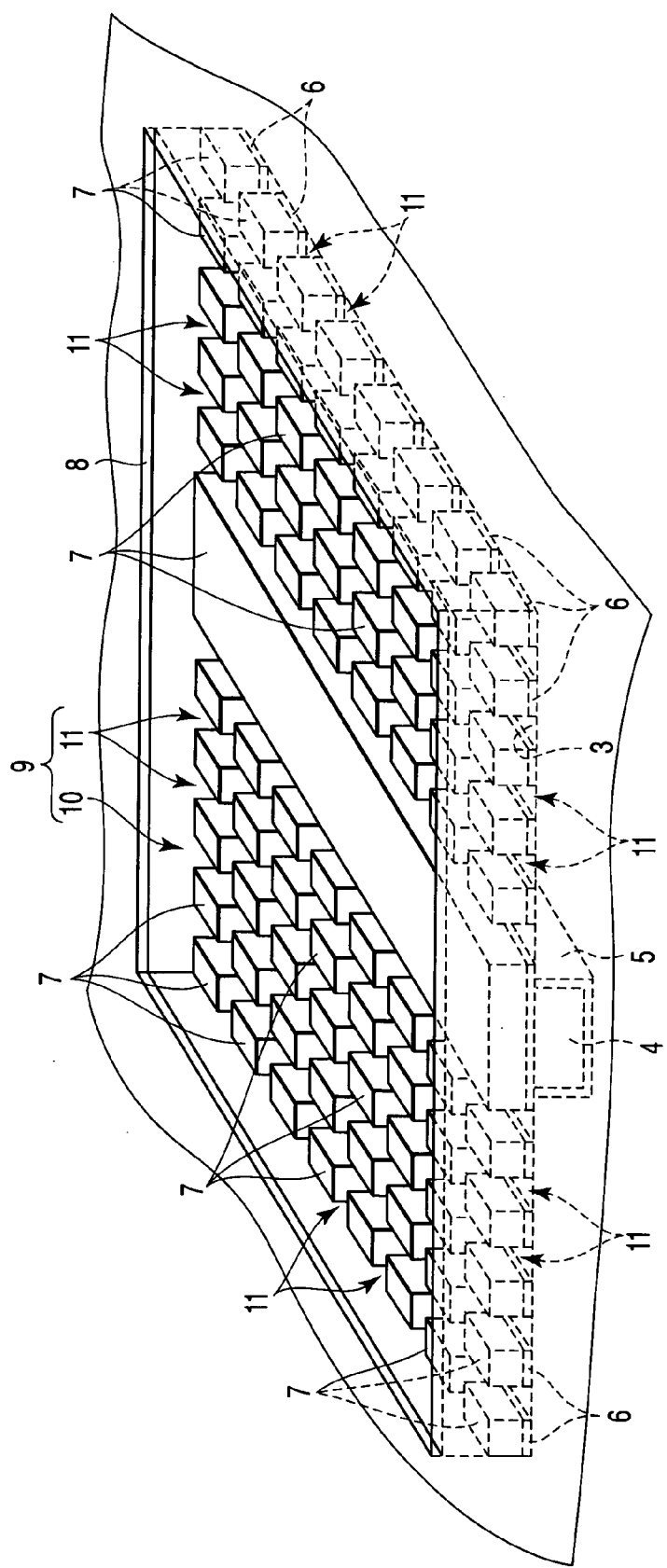
FIG. 4 is a perspective view showing a process of manufacturing a semiconductor device according to the first embodiment.

Next, as shown in FIGS. 2 to 4, a recess 9 for forming a wiring 14 in the n-th layer serving as a first conductor and a via plug 15 serving as a second conductor to be connected to the lower part (lower surface) of the wiring 14 in the n-th layer is formed, in a predetermined pattern, inside the d-TEOS film 8 and low-k inter-level dielectric film 7 in the n-th layer, and SiCN film 6 in the (n−1)-th layer using a lithography process and the like. FIG. 3 is a plan view showing the recess 9 shown in FIG. 2 as viewed from above, and FIG. 4 is a perspective view of the recess 9 shown in FIG. 3. FIG. 2 is a cross-sectional view taken along the dashed line A-A' in FIG. 3.

In the first embodiment, the wiring 14 in the n-th layer is formed as a so-called dual-damascene wiring. That is, the wiring 14 in the n-th layer is formed integrally with the via plug 15. Therefore, as shown in FIGS. 2 to 4, the recess 9 including a recess 10 for wiring and a recess 11 for via plug, which are integrally formed, is formed inside the d-TEOS film 8 and low-k inter-level dielectric film 7, and SiCN film 6. It should be noted that, in the first embodiment, the wiring 14 in the n-th layer is not electrically connected to the lower layer Cu wiring 4. That is, the via plug 15 is not provided above the lower layer Cu wiring 4. Therefore, the recess 11 for via plug is formed in the lower region of the recess 10 for wiring other than the area above the lower layer Cu wiring 4.

In the first embodiment, the wiring in the n-th layer is formed as a broad wiring in which the length along width direction (line width) that crosses the longitudinal direction is about 1 μm or more. More specifically, the wiring 14 in the n-th layer is formed as a broad wiring having a width of about 10 μm. At the same time, a plurality of via plugs 15 are formed by extending them along the downward direction from the wiring 14 in the n-th layer and by extending respectively along the longitudinal direction of the wiring 14 in the n-th layer and along the direction perpendicular to the longitudinal direction of the wiring 14 in the n-th layer in such a manner as to be spaced apart from each other. More specifically, a plurality of via plugs 15, each having a linear shape of 0.1 μm width, are formed lengthwise and breadthwise respectively along the longitudinal direction (first direction) of the wiring 14 in the n-th layer and along the direction (second direction) perpendicular to the longitudinal direction of the wiring 14 in the n-th layer. At this time, the via plugs 15 formed along the longitudinal direction of the wiring 14 in the n-th layer and the via plugs 15 formed along the direction perpendicular to the longitudinal direction of the wiring 14 in the n-th layer cross each other to form a so-called lattice shape. The pitch between the adjacently provided via plugs 15 is set to about 0.2 μm which is double the width of each via plug 15. In this manner, the recess 9 having the pattern shown in FIGS. 2 to 4 is formed inside the d-TEOS film 8, low-k inter-level dielectric film 7, and SiCN film 6.

Figure 5:
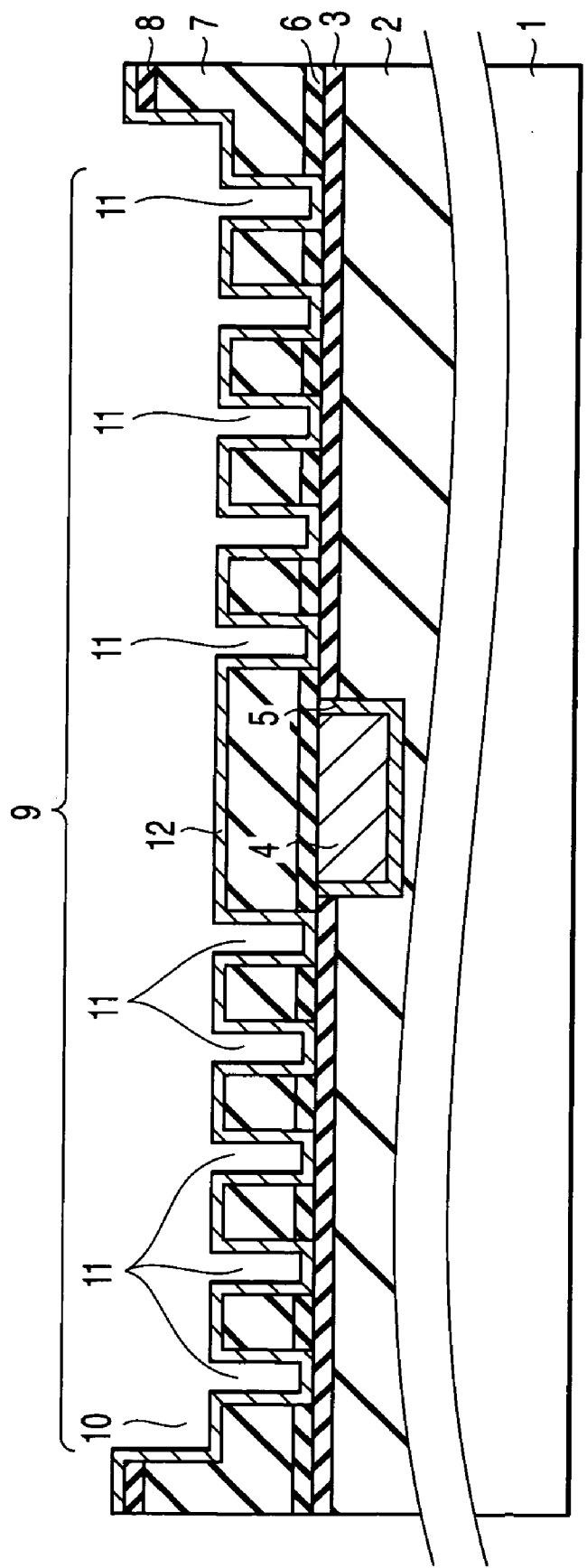
FIG. 5 is a cross-sectional view showing a process of manufacturing a semiconductor device according to the first embodiment.
Figure 6:
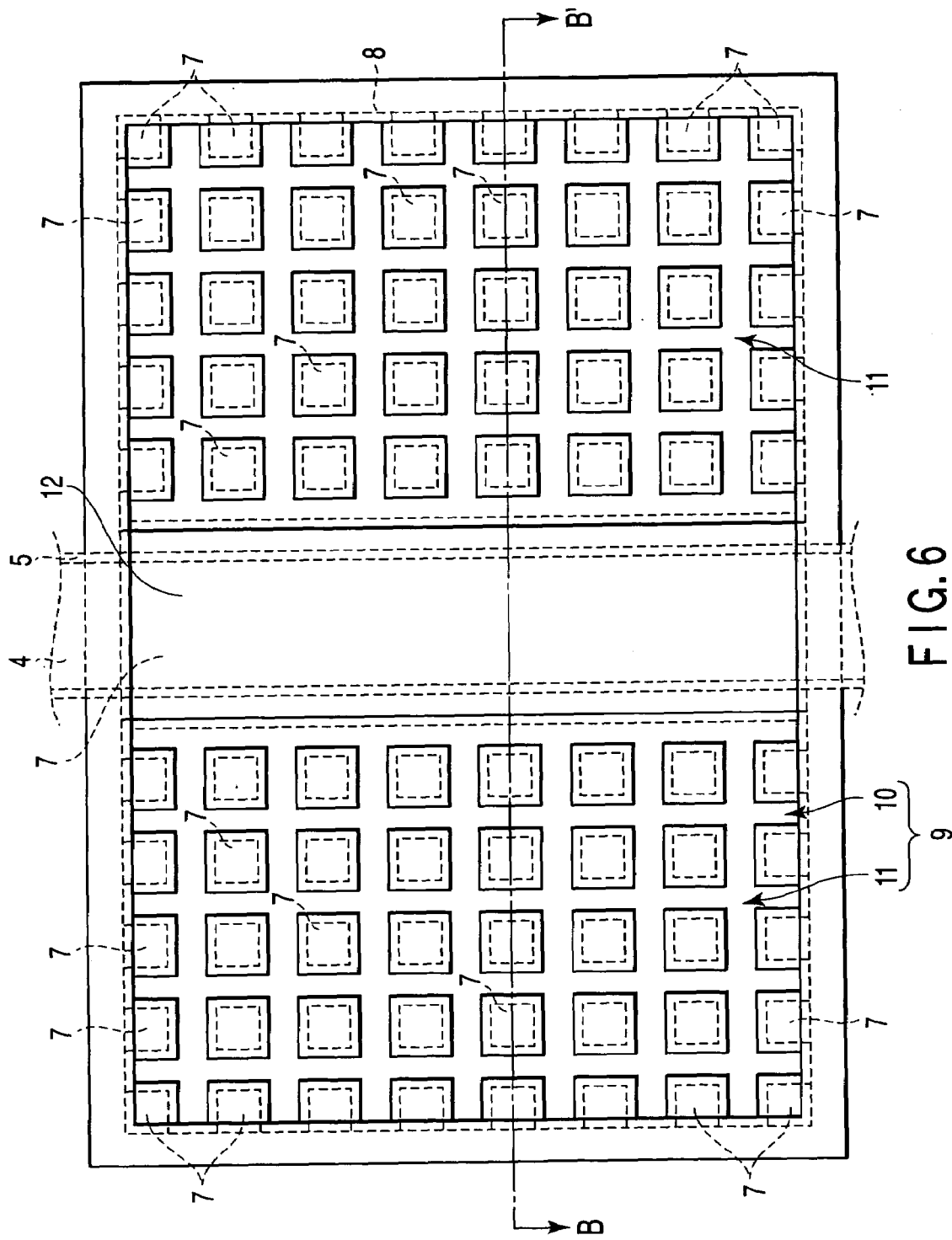
FIG. 6 is a plan view showing a process of manufacturing a semiconductor device according to the first embodiment.

Next, as shown in FIGS. 5 and 6, a barrier metal film 12 for the wiring 14 in the n-th layer and respective via plugs 15 is formed in such a manner as to cover the surface of the d-TEOS film 8 in the n-th layer and the inside of the recesses 10 and 11 for wiring and via plug. Like the abovementioned barrier metal film 5 for the lower layer Cu wiring 4, a Ta film is used as the barrier metal film 12. The barrier metal film 12 is deposited using a sputtering film forming method with bias application to make the film thickness thereof about 10 nm. After that, although not shown, the Si substrate 1 on which the barrier metal film 12 has been formed is fed in high vacuum environment so as not to be exposed to air to a processing room in a sputtering apparatus for forming a Cu film. FIG. 6 is a plan view showing the recess 9 shown in FIG. 5 as viewed from above. FIG. 5 is a cross-sectional view taken along the dashed line B-B' in FIG. 6.

Figure 7:
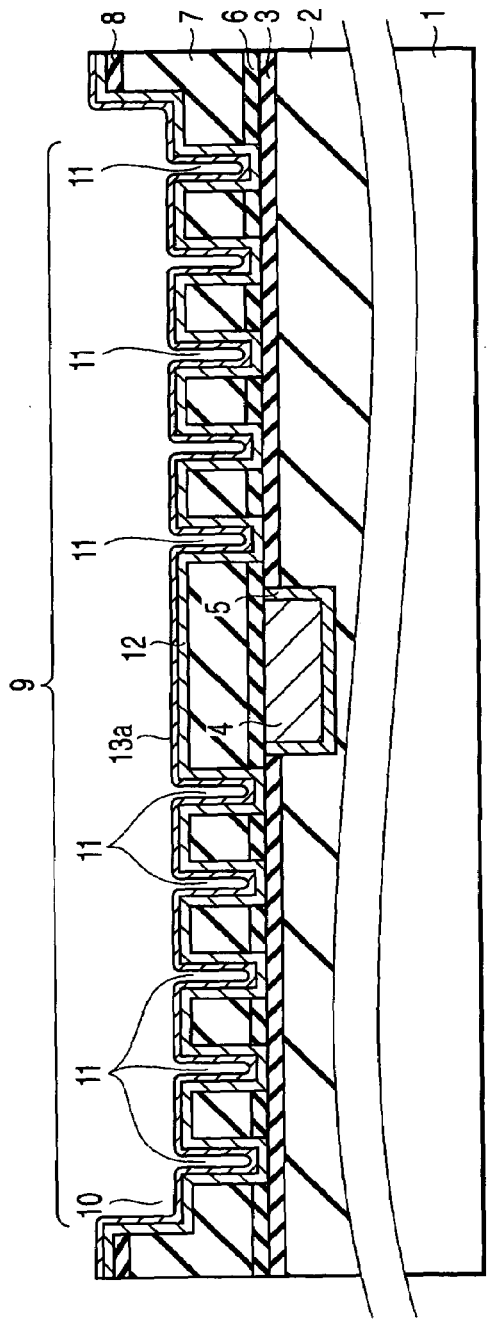
FIG. 7 is a cross-sectional view showing a process of manufacturing a semiconductor device according to the first embodiment.

Next, as shown in FIG. 7, a Cu layer (film) 13a for plating seed to become a part of the wiring 14 in the n-th layer and respective via plugs 15 is formed in such a manner as to cover the surface of the barrier metal film 12. The Cu plating seed layer 13a is deposited, in vacuum environment, continuously from the barrier metal film 12 using an SIS (Self Ionized Sputter) sputtering method to make the film thickness thereof about 70 nm in solid film.

Figure 8:
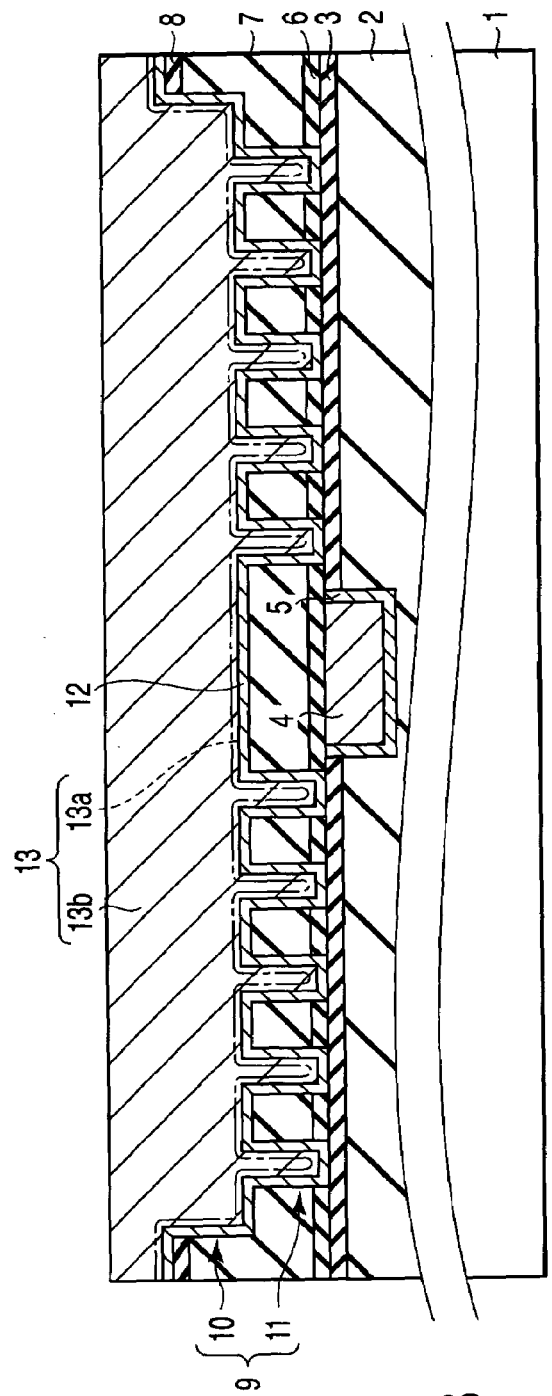
FIG. 8 is a cross-sectional view showing a process of manufacturing a semiconductor device according to the first embodiment.

Subsequently, as shown in FIG. 8, a Cu plating film 13b is formed on the surface of the Cu plating seed layer 13a. The Cu plating film 13b is formed using an electroplating method while being integrated with the Cu plating seed layer 13a. As a result, the Cu film 13 to become a material of the wiring 14 in the n-th layer and respective via plugs 15 is formed on the surface of the barrier metal film 12.

Figure 9:
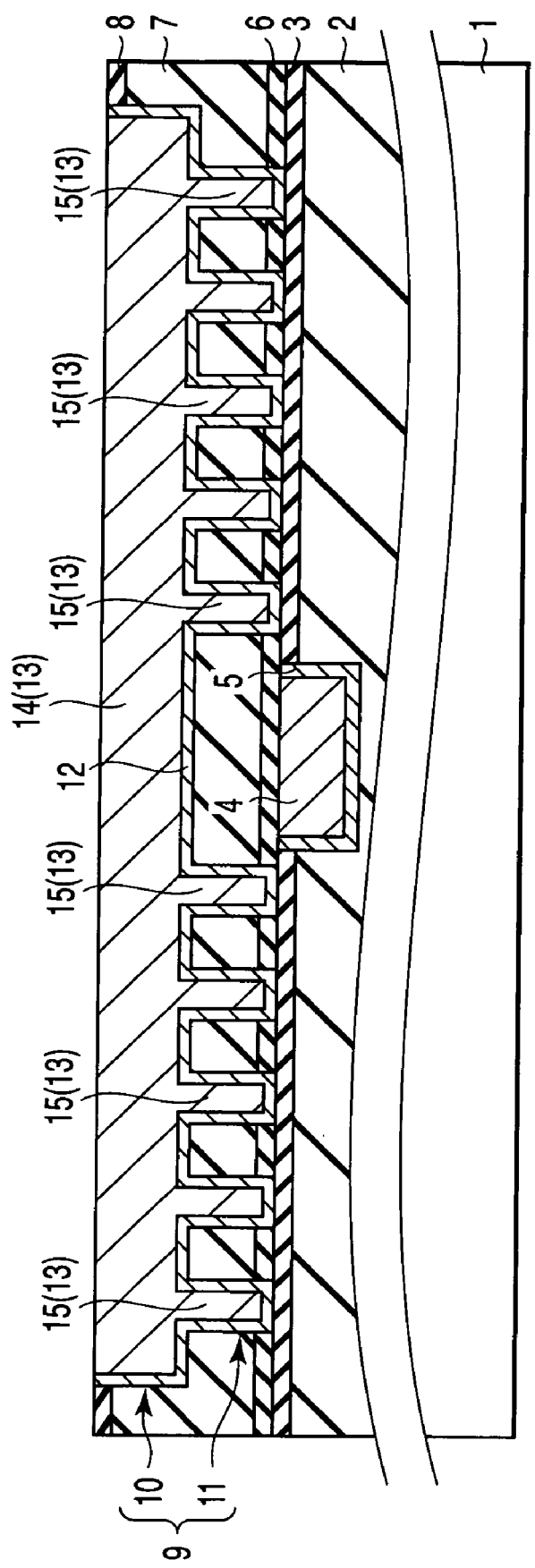
FIG. 9 is a cross-sectional view showing a process of manufacturing a semiconductor device according to the first embodiment.
Figure 10:
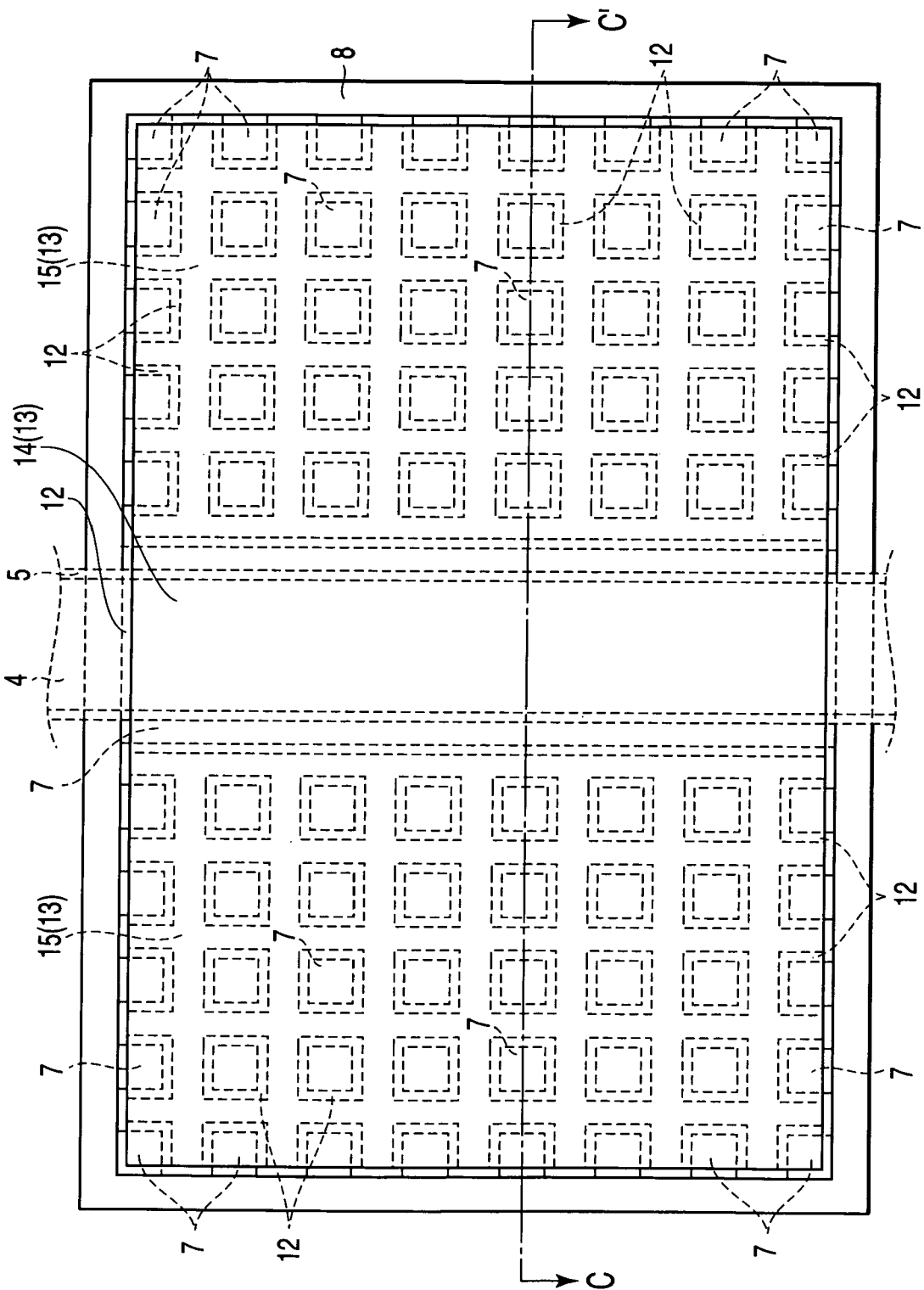
FIG. 10 is a plan view showing a process of manufacturing a semiconductor device according to the first embodiment.

Next, as shown in FIGS. 9 to 11, the barrier metal film 12 and Cu film 13 on the surface of the d-TEOS film (capping film) 8 in the n-th layer are polished and removed by a CMP method. As a result, unnecessary barrier metal film 12 and Cu film 13 that exist at the outside of the recesses 10 and 11 for wiring and via plug are removed from the d-TEOS film 8; whereas the barrier metal film 12 and Cu film 13 are left only at the inside of the recesses 10 and 11 for wiring and via plug. That is, the barrier metal film 12 and Cu film 13 to become the wiring 14 in the n-th layer and respective via plugs 15 are buried only at the inside of the recesses 10 and 11 for wiring and via plug. As a result, the wiring 14 in the n-th layer made of Cu and having a dual-damascene structure in which the wiring is formed integrally with the via plugs 15 is formed inside the d-TEOS film 8 and low-k inter-level dielectric film 7 in the n-th layer, and SiCN film 6 in the (n−1)-th layer. FIG. 10 is a plan view showing the broad wiring 14 shown in FIG. 9 as viewed from above. FIG. 11 is a plan view showing the broad wiring 14 shown in FIG. 9 as viewed from below. FIG. 9 is a cross-sectional view taken along the dashed line C-C' in FIG. 10.

Figure 12:
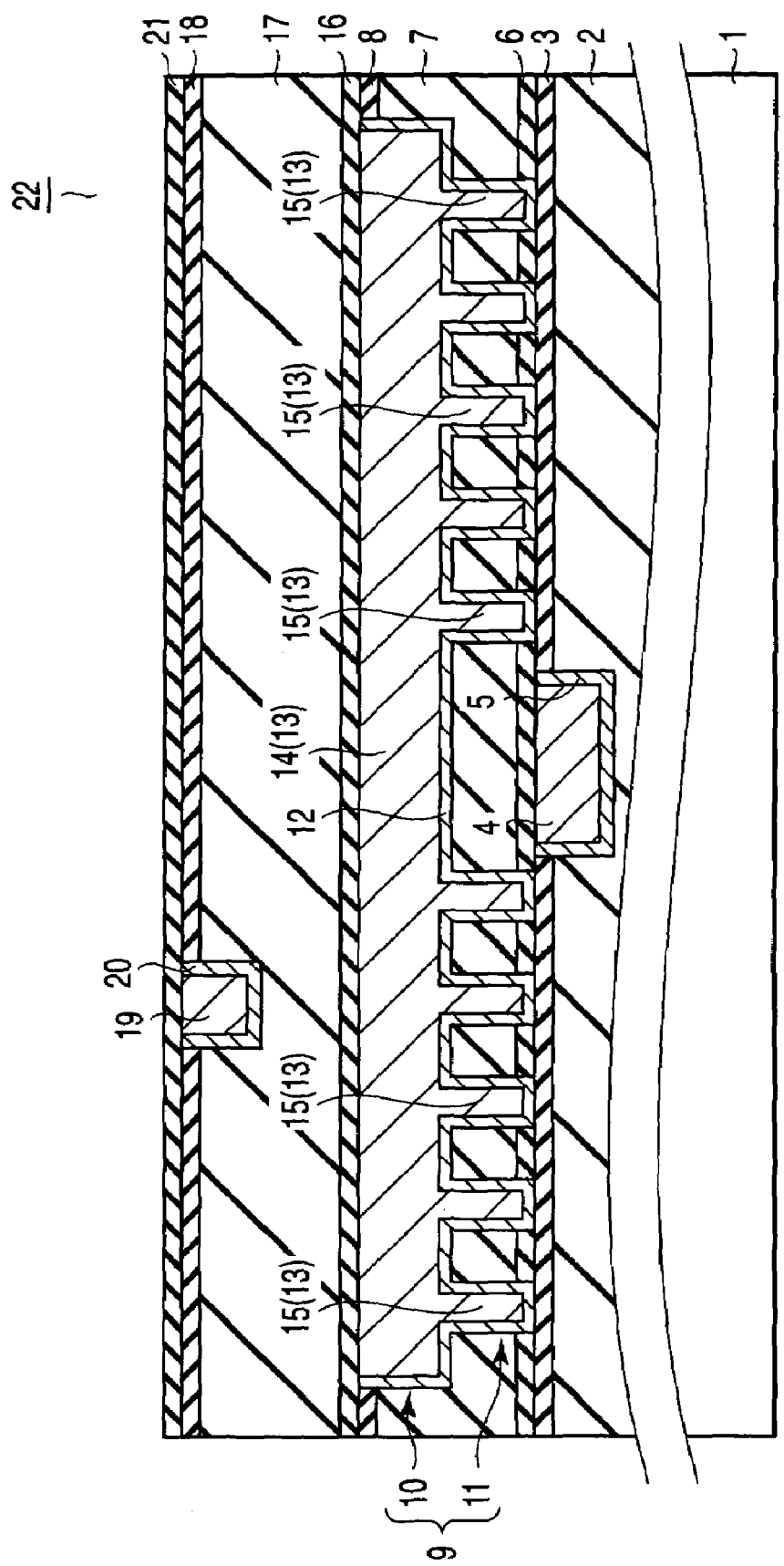
FIG. 12 is a cross-sectional view showing a process of manufacturing a semiconductor device according to the first embodiment.

Next, as shown in FIG. 12, a top barrier film (passivation film) 16 in the n-th layer is formed, by the same method as in the case of forming the top barrier film 6 in the (n−1)-th layer, in such a manner as to cover the surfaces of the wiring (Cu broad wiring) 14 and d-TEOS film 8 in the n-th layer. The SiCN film is used also for the n-th passivation film 16. Subsequently, a low-k inter-level dielectric film 7 and capping film (d-TEOS film) 18 in the (n+1)-th layer are sequentially stacked, by the same method as in the case of forming the low-k inter-level dielectric film 7 and d-TEOS film 8 in the n-th layer, on the surface of the passivation film 16 in the n-th layer. Further, an upper layer wiring 19 serving as an upper layer conductor and a barrier metal film 20 are formed inside the low-k inter-level dielectric film 17 and capping film (d-TEOS film) 18 in the (n+1)-th layer using an embedding method in the same manner as the case of forming the lower layer wiring 4 and barrier metal film 5. Like the lower layer wiring 4, the upper layer wiring 19 is made of, for example, Cu. The barrier metal film 20 is also made of, for example, Ta like the barrier metal film 5. Subsequently, a top barrier layer 21 in the (n+1)-th layer is formed, by the same method as the case of forming the top barrier films 6 and 16 in the (n−1)-th and n-th layers, in such a manner as to cover the upper layer Cu wiring 19 and d-TEOS film 18 in the (n+1)-th layer. The SiCN film is used also for the top barrier film 21 in the (n+1)-th layer.

Thereafter, through a predetermined process, a desired semiconductor device 22 according to the first embodiment shown in FIG. 12 is obtained. That is, the semiconductor device 22 has the Cu broad wiring 14 having a dual-damascene structure in which the wiring 14 is integrally formed with a plurality of Cu via plugs 15 constituting a lattice shape.

Figure 13:
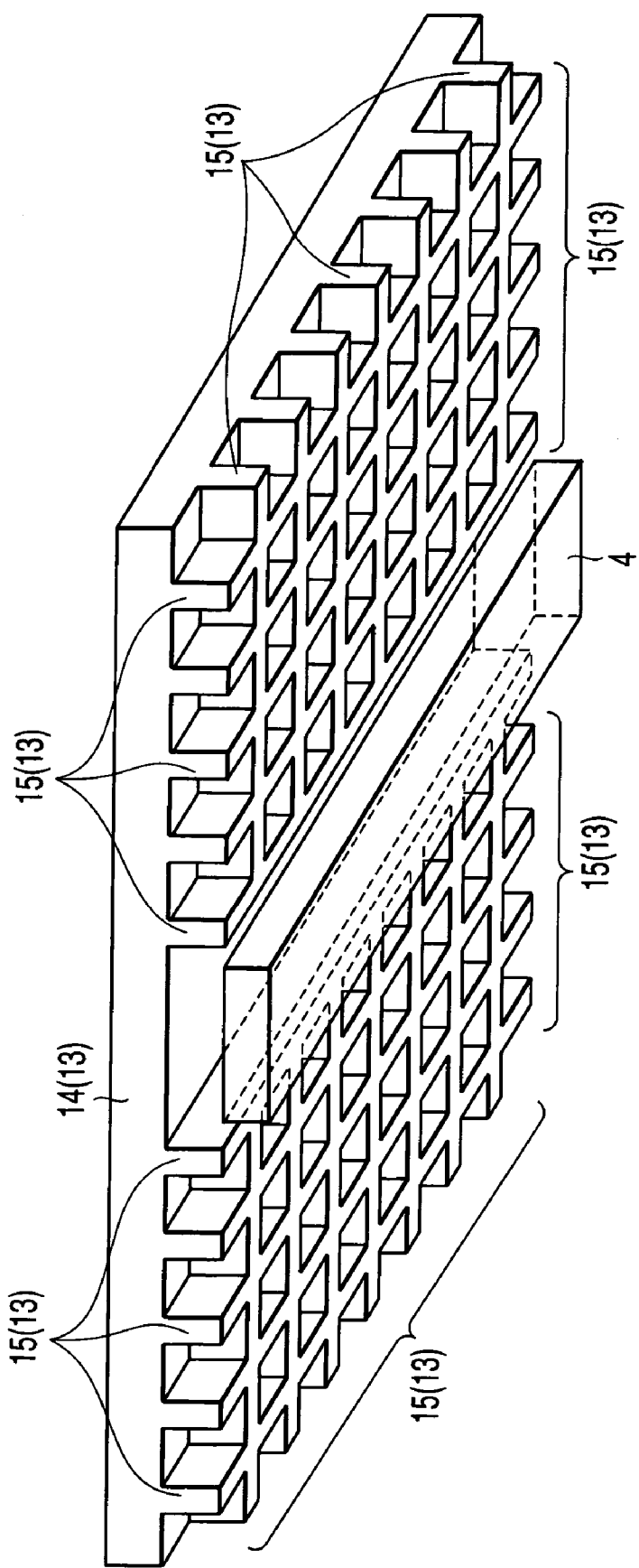
FIG. 13 is a perspective view showing a process of manufacturing a semiconductor device according to the first embodiment.
Figure 14:
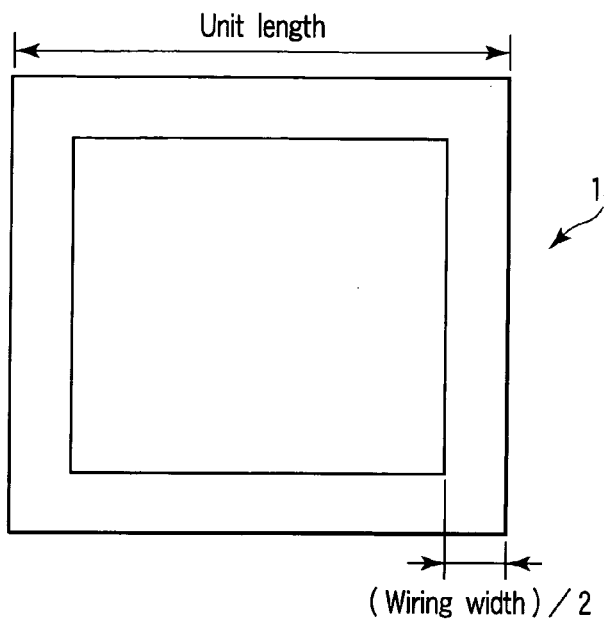
FIG. 14 is a plan view showing an example of a semiconductor device according to the first embodiment.

FIG. 13 is a perspective view showing the Cu broad wiring 14 and respective Cu via plugs 15 according to the first embodiment, which has been formed by the abovementioned processes, as viewed from the lower layer Cu wiring 14 side. For simplicity of illustration, the barrier metal films 5 and 12, low-k inter-level dielectric films 2 and 7 in the (n−1)-th and n-th layers, and the like are omitted in FIG. 13.

As shown in FIG. 13, the Cu broad wiring 14 has a rectangular solid shape extending along the width direction of the wiring 14. The respective Cu via plugs 15 are electrically connected to the lower surface of the Cu broad wiring 14, and extends toward the lower side of the Cu broad wiring 14. Further, the respective Cu via plugs 15 extend, along the lower surface of the Cu broad wiring 14, along the longitudinal direction (width direction in FIG. 13) of the Cu broad wiring 14 and along the direction (depth direction in FIG. 13) perpendicular to the longitudinal direction of the Cu broad wiring 14 in such a manner as to be spaced apart from each other. More specifically, the Cu via plugs 15 formed along the longitudinal direction of the Cu broad wiring 14 and the Cu via plugs 15 formed along the direction perpendicular to the longitudinal direction of the Cu broad wiring 14 cross each other to form a so-called lattice shape. As described above, the respective Cu via plugs 15 of the first embodiment is formed not in a general isolated-island shape but in a linear shape, so that it can also be referred to as "Cu via wiring". Alternatively, the Cu via wiring formed like walls constituting a lattice shape as the present embodiment can also be referred to as "Cu via fence". As described above, each of the Cu via wirings 15 has a width of about 0.1 μm. At the same time, a pitch between the adjacently provided Cu via wiring 15 that extend along the same direction is set to about 0.2 μm.

Further, since the respective Cu via wirings 15 are not electrically connected to the lower layer Cu wiring 4 as described above, the wirings 15 are formed in the lower region of the Cu broad wiring 14 other than the area above the lower layer Cu wiring 4. That is, each of the Cu via wirings 15 is provided as a so-called sacrificial wiring (dummy wiring, continuous sacrificial via layer). Such a Cu via wiring 15 can also be referred to as "Cu dummy via wiring (Cu sacrificial via wiring)" or "Cu dummy via fence".

With reference mainly to FIG. 14 and Table 1, a test made by the present inventors will next be described below.

Firstly, although not shown, two samples are prepared. One is a sample (hereinafter referred to as "first sample") according to the present embodiment constituted by a two-layered wiring structure of the Cu broad wiring 14 having a dual-damascene structure including the abovementioned lower layer Cu wiring 4 and lattice shaped Cu dummy via wirings 15. The other is a sample (hereinafter referred to as "second sample") according to a prior art constituted by a two-layered wiring structure in which the Cu broad wiring 14 that does not have the lattice shaped Cu dummy via wiring 15 is merely provided above the lower layer Cu wiring 4. That is, the wiring structure of the second sample does not have a metal portion in the via layer on which the Cu dummy via wirings 15 are to be formed in the first sample. In the first and second samples, the width of the Cu broad wiring 14 serving as an upper layer wiring is set to about 10 μm, and the Cu broad wiring 14 is provided above the entire substrate 1 with about a 11 μm pitch. Further, in the first sample, each of the Cu dummy via wirings 15 having a unit-cell shape shown in FIG. 14, the size of which is variously changed as shown in Table 1, is formed on the Cu broad wiring 14 having a width of about 10 μm.

Subsequently, the first and second samples, each having the above configuration, were tested for the purpose of evaluating the reliability of the samples. Firstly, ten times of heat cycles (from room temperature to about 400° C., which is generated in a normal multi-layer wiring process) are applied to the first and second samples. After that, a cutting process that is performed in a general packaging process is applied to the first and second samples. Subsequently, after the cut first and second samples are sealed in a package by a sealing resin, 1000 times of TCT test of about −65 to 125° C. are performed for the packaged first and second samples. Table 1 shows the result of the TCT test with regards to the first sample.

As can be seen from Table 1, in the case where the Cu dummy via wirings 15 are formed on the lower surface of the Cu broad wiring 14, it is preferable to form the Cu dummy via wiring 15 such that the coverage of the lower surface of the Cu broad wiring 14 by the Cu dummy via wirings 15 becomes 10% or more, more preferably, 20% or more. That is, with the above setting, it is possible to alleviate a so-called horizontal load stress generated along the main surfaces of the low-k inter-level dielectric films 2 and 7 and Cu broad wiring 14 and a so-called vertical load stress generated along the thickness direction of the low-k inter-level dielectric films 2 and 7 and Cu broad wiring 14. That is, the mechanical strength of the low-k inter-level dielectric films 2 and 7 in which the Cu broad wiring 14 and lower layer Cu wiring 4 are formed and dielectric films 3, 6, 8, and 16 formed, in an adjacent manner, above and below the low-k inter-level dielectric films 2 and 7 against the horizontal load stress and vertical load stress is increased. As a result, according to the above setting, it is possible to prevent delamination and the like caused at the interface of the low-k inter-level dielectric films 2 and 7 in which the Cu broad wiring 14 and lower layer Cu wiring 4 are formed and dielectric films 3, 6, 8, and 16 formed, in an adjacent manner, above and below the low-k inter-level dielectric films 2 and 7. On the other hand, in the second sample in which the Cu dummy wirings 15 are not formed on the lower surface of the Cu broad wiring 14, defect occurs at the rate of about 10%.

TABLE 1

| | | | Dummy wiring width (μm) | | | | | |
|---|---|---|---|---|---|---|---|---|
| | | | 0.1 | 0.2 | 0.3 | 0.5 | 1 | 2 | 5 |
| Coverage (%) | 1 | Unit length | — | — | — | — | — | — | — |
| | | Test result | — | — | — | — | — | — | — |
| | 5 | Unit length | 3.95 | 7.9 | — | — | — | — | — |
| | | Test result | X | X | — | — | — | — | — |
| | 10 | Unit length | 1.94 | 3.89 | 5.85 | 9.74 | — | — | — |
| | | Test result | Δ | Δ | Δ | X | — | — | — |
| | 20 | Unit length | 0.94 | 1.89 | 2.84 | 4.74 | 9.47 | — | — |
| | | Test result | ○ | ○ | ○ | Δ | X | — | — |
| | 30 | Unit length | 0.61 | 1.22 | 1.84 | 3.06 | 6.12 | — | — |
| | | Test result | ○ | ○ | ○ | ○ | ○ | — | — |
| | 40 | Unit length | 0.44 | 0.89 | 1.33 | 2.22 | 4.44 | 8.87 | — |
| | | Test result | ○ | ○ | ○ | ○ | ○ | ○ | — |
| | 50 | Unit length | 0.34 | 0.68 | 1.02 | 1.71 | 3.41 | 6.83 | — |
| | | Test result | ○ | ○ | ○ | ○ | ○ | ○ | — |
| | 60 | Unit length | 0.27 | 0.54 | 0.82 | 1.36 | 2.72 | 5.44 | — |
| | | Test result | ○ | ○ | ○ | ○ | ○ | ○ | — |
| | 70 | Unit length | 0.22 | 0.44 | 0.66 | 1.11 | 2.21 | 4.42 | — |
| | | Test result | ○ | ○ | ○ | ○ | ○ | ○ | — |
| | 80 | Unit length | 0.18 | 0.36 | 0.54 | 0.9 | 1.81 | 3.62 | 9.04 |
| | | Test result | ○ | ○ | ○ | ○ | ○ | ○ | ○ |
| | 90 | Unit length | 0.14 | 0.29 | 0.44 | 0.73 | 1.46 | 2.92 | 7.31 |
| | | Test result | ○ | ○ | ○ | ○ | ○ | ○ | ○ |

X: Delamination is generated
Δ: Delamination is not generated. Discoloration of Cu wiring is generated 10 hours after test at a temperature of 100° C. and a humidity of 90%
○: Both delamination and discoloration are not generated As described above, the test performed by the present inventor has revealed that when the Cu dummy via wirings 15 are formed on the lower surface of the Cu broad wiring 14 such that the coverage of the lower surface of the Cu broad wiring 14 by the Cu dummy via wirings 15 becomes about 10% or more, it is possible to increase reliability of the semiconductor device 22.

As has been described above, according to the first embodiment, by forming a plurality of Cu dummy via wirings 15 having a lattice-shaped via fence structure on the lower surface of the Cu broad wiring 14, it is possible to increase the strength of the wirings 4 and 14, respective dielectric films near the region in which the wirings 4 and 14 are formed, including the low-k inter-level dielectric films 2 and 7 and dielectric films 3, 6, 8, and 16 irrespective of the size, shape, or coverage of the wirings 4 and 14 formed in the low-k inter-level dielectric films 2 and 7 and actually receive a current. That is, it is possible to provide a highly reliable semiconductor device 22 having a Cu multilayer wiring/low-k inter-level dielectric film structure without increasing the number of wiring layers.

Second Embodiment

Figure 15:
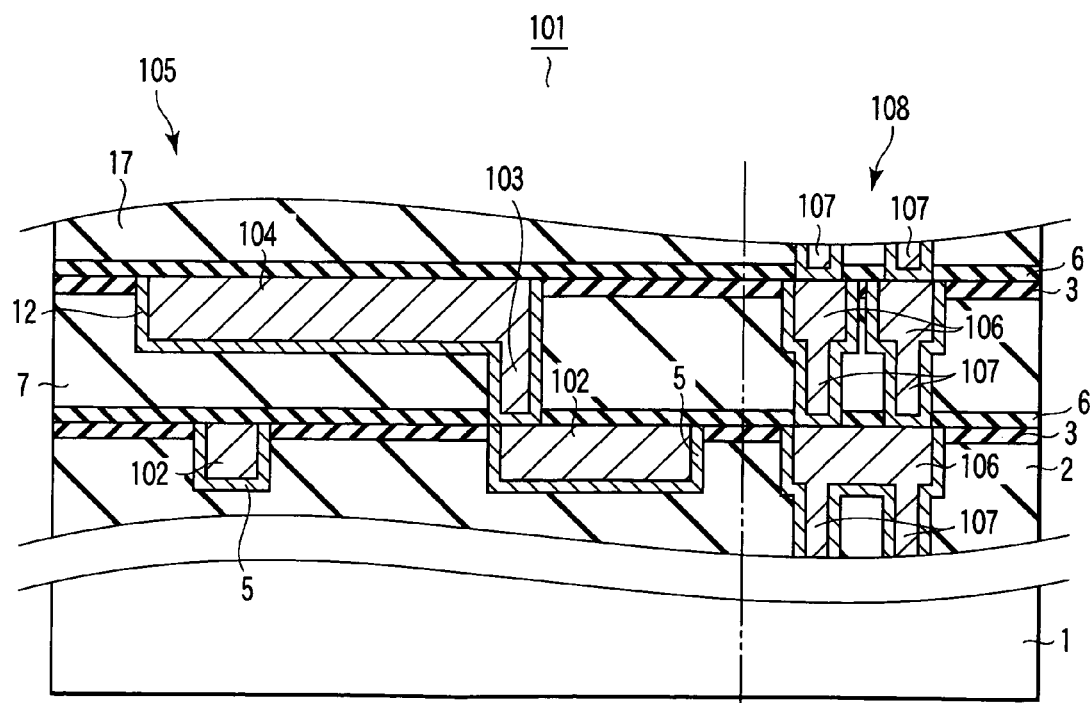
FIG. 15 is a cross-sectional view showing a semiconductor device serving as a comparison example to a second embodiment.
Figure 16:
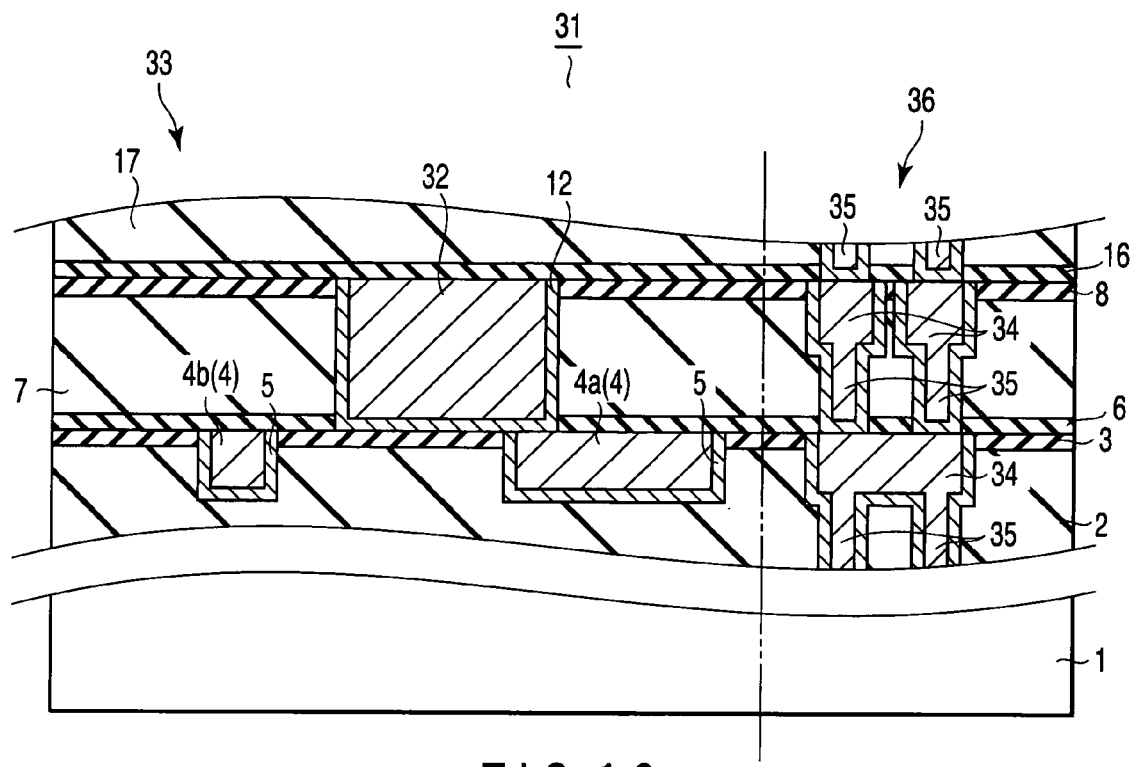
FIG. 16 is a cross-sectional view showing a semiconductor device according to the second embodiment.
Figure 17:
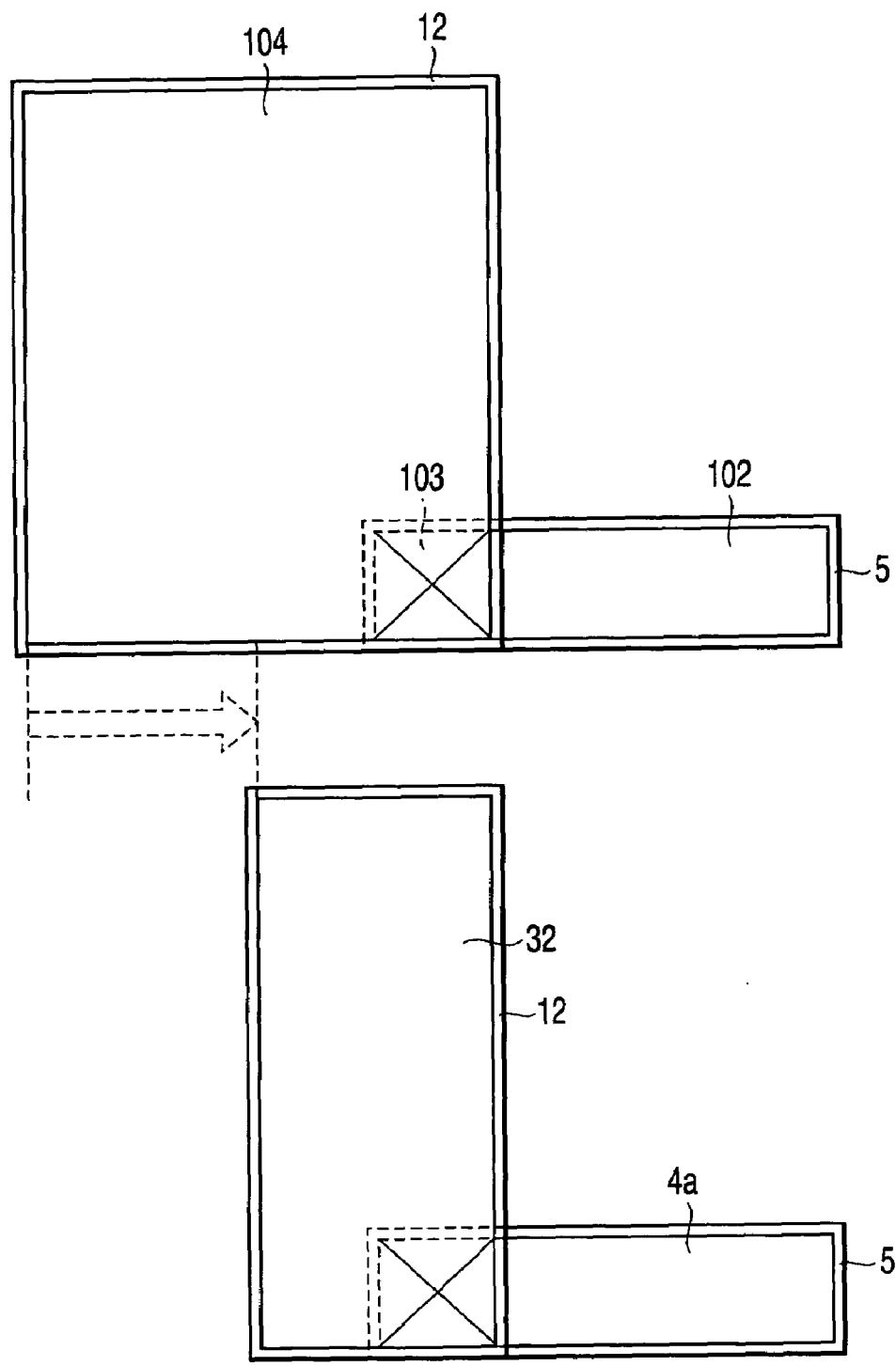
FIG. 17 is a plan view showing a semiconductor device according to the second embodiment and a semiconductor device serving as a comparison example to the second embodiment.

A second embodiment of the present invention will next be described below with reference to FIGS. 15 to 17. FIG. 15 is a cross-sectional view showing a semiconductor device serving as a comparison example to the second embodiment. FIG. 16 is a cross-sectional view showing a semiconductor device according to the second embodiment. FIG. 17 is a plan view showing a semiconductor device according to the second embodiment and a semiconductor device serving as a comparison example to the second embodiment. Note that, in the second embodiment, the same reference numerals denote the same or corresponding parts as in the first embodiment, and the detailed description thereof will be omitted.

In the second embodiment, the mechanical strength of the region near the wiring is increased by extending the wiring to the layer situated on the lower side of the actually used wiring, on which the via plug is formed. Hereinafter, detailed description will be made. The manufacturing process of the second embodiment is the same as that of the first embodiment, and the description thereof will be omitted.

Before the description of the second embodiment, a wiring structure of semiconductor device 101 as a comparison example will briefly be described with reference to FIG. 15.

As shown in FIG. 15, in the semiconductor device 101 as a comparison example, a lower layer wiring 102 is electrically connected to an upper layer broad wiring 104 through a via plug 103 formed into an isolated-island shape. However, so as to be described as follows, the horizontal stress load and vertical stress load caused due to a thermal stress are easily applied to the broad wiring 104. Consequently, a high horizontal stress load or vertical stress load is likely to be applied to the via plug 103 to destroy the connection portion between the broad wiring 104 and via plug 103.

That is to say, a via section that connects wires in the semiconductor device is one of the sites on which a thermal stress generated in the inside of the semiconductor device easily concentrates. Further, it has already been found that influence of the thermal stress to the via section becomes more obvious in the case where the low-k film having a Young's modulus lower than a commonly-used dielectric film or a Cu wiring having a linear expansion coefficient higher than an Al wiring is used to manufacture a semiconductor device.

Further, when the low-k film is used to form an inter-level dielectric film, delamination in the inter-level dielectric film due to low bonding strength at the interface between the low-k films or between the low-k film and other dielectric film or low breakdown strength of the low-k film itself is easily caused not only in the case where the thermal stress is generated in the inter-level dielectric film during heating and cooling processes (process of rising and falling of temperature) for the inter-level dielectric film or the like but also in other cases. For example, in the case where a shearing stress is applied to the inter-level dielectric film in a CMP process for burying a via plug and wiring in the inter-level dielectric film, during a product inspection process such as probing, or during a post-process such as packaging, delamination in the inter-level dielectric film is easily caused. In order to prevent the delamination in the inter-level dielectric film due to the deterioration in the mechanical strength or the like of the low-k inter-level dielectric film, inventors of the present invention has already been proposed a technique that forms so-called a dummy wiring or dummy via plug in the inter-level dielectric film to substantially increase the strength of the inter-level dielectric film including the via section and wiring section in, for example, U.S. patent application Ser. No. 10/653,186. The entire contents of U.S. patent application Ser. No. 10/653, 186 are incorporated herein by reference.

However, further studies made by the present inventors have revealed that, there is room of a stepped up measure for the external load in terms of the shape of the dummy via plug or the area where the actual wiring to which a current is actually supplied, in a semiconductor device using a low-k film to form an inter-level dielectric film and having a high surface coverage. More specifically, in a so-called broad wiring section where a wiring having a width greater than that of a normal wiring is formed, the area occupied by the actual wiring inevitably becomes larger than in the case of a normal wiring section. Accordingly, the area for providing a sufficient number of and sufficient size of dummy wiring or dummy plug that can endure the above various external loads inevitably becomes small in the inter-level dielectric film. In particular, in the vicinity of the wiring section where the resistance characteristics of the dummy wiring or dummy via plug against the external load can be exercised with the utmost efficiency, the area where the dummy wiring or dummy via plug is formed inevitably becomes small. Further, the broad wiring is more likely to receive the external load then a normal wiring. As a result, also the external load (external force) applied to the dummy wiring or dummy via plug formed in the broad wiring section inevitably becomes greater than that applied to the dummy wiring or dummy via plug formed in a normal wiring section.

As a result, in the case where the dummy wiring or dummy via plug for a normal wiring section is used in the broad wiring section without modification in the low-k inter-level dielectric film, it becomes difficult to ensure a sufficient strength against the external force applied to the dummy wiring or dummy via plug. That is, there is a possibility that the strength of the actual wiring section cannot be increased. As a matter of course, delamination in the inter-level dielectric film due to low bonding strength at the interface between the low-k films or between the low-k film and other dielectric film or low breakdown strength of the low-k film itself is easily caused. This may deteriorate endurance, reliability, and capability of the entire semiconductor device including the low-k inter-level dielectric film.

The second embodiment is made to solve a problem described above. Hereinafter, a semiconductor device 31 according to the second embodiment will be described with reference to FIG. 16.

The left side of the double dashed line in FIG. 15 is an effective wiring section 105 in which the lower layer wiring 102 and broad wiring 104 each of which actually receives a current to serve as an effective wiring are formed. The right side of the double dashed line in FIG. 15 is a mechanical reinforcement section 108 in which a dummy wiring (sacrificial wiring) 106 or dummy via plug (sacrificial via plug) 107 for making it harder to apply the horizontal stress load or vertical stress load to the lower layer wiring 102 and broad wiring 104 each of which actually receives a current to serve as an effective wiring is formed.

As shown in FIG. 16, in the semiconductor device 31 of the second embodiment, a Cu wiring 32 in the n-th layer serving as a first conductor is provided to overlap a lower layer Cu wiring 4a and a low-k inter-level dielectric film 2 in the (n–1)-th layer, the Cu wiring 4a constituting a lower layer Cu wiring 4 which is formed in the (n–1)-th layer and which serves as a lower layer conductor and having the same conductive passage as the Cu wiring 32. At the same time, the Cu wiring 32 passes through a capping film 8 and low-k inter-level dielectric film 7 in the n-th layer, and top barrier film 6 in the (n–1)-th layer along the film thickness direction. The Cu wiring 32 is electrically connected to the lower layer Cu wiring 4a through a barrier metal film (Ta film) 12 to serve as a part of the same conductive passage as the lower layer Cu wiring 4a.

As described above, the second embodiment can obtain the same advantage as the abovementioned first embodiment. Further, by extending the Cu wiring 32 to the layer on the lower side of the low-k inter-level dielectric film 7, on which the via plug is to be formed in a conventional case, it is possible to gain a substantial wiring cross-section for the Cu wiring 32. As a result, as shown in FIG. 17, the width of the Cu wiring 32 can be reduced. At the same time, it is possible to increase the mechanical strength only by the Cu wiring 32, which serves as an effective wiring, formed in an effective wiring section 33 denoted by the area on the left side of the double dashed line in FIG. 16. The right side of the double dashed line in FIG. 16 is a mechanical reinforcement section 36 in which a dummy wiring (sacrificial wiring) 34 or dummy via plug (sacrificial via plug) 35 for making it harder to apply the horizontal stress load or vertical stress load to the lower layer wiring 4 and Cu wiring 32 each of which actually receives a current to serve as an effective wiring is formed. As described above, according to the second embodiment, by extending the Cu wiring 32, serving as an effective wiring, to the part (layer) on which the via is to be formed under normal circumstances, it is possible to improve the mechanical strength as compared to a conventional structure in which a metal layer does not exist in a via layer.

Third Embodiment

Figure 18:
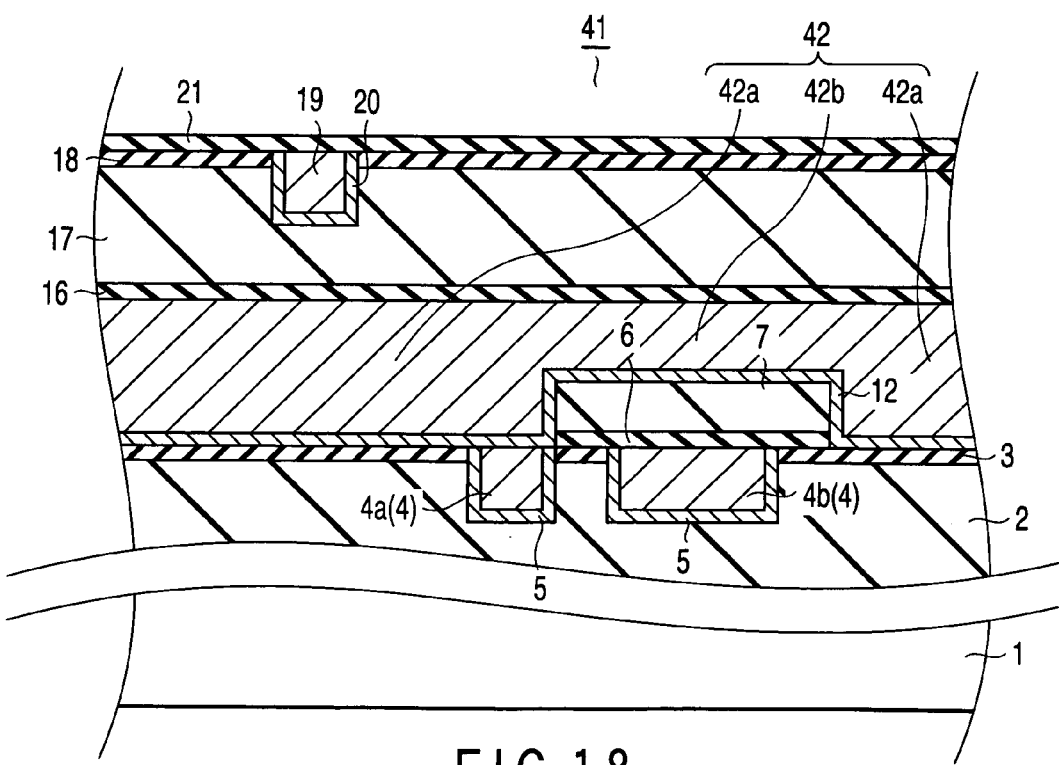
FIG. 18 is a cross-sectional view showing a semiconductor device according to a third embodiment.
Figure 19:
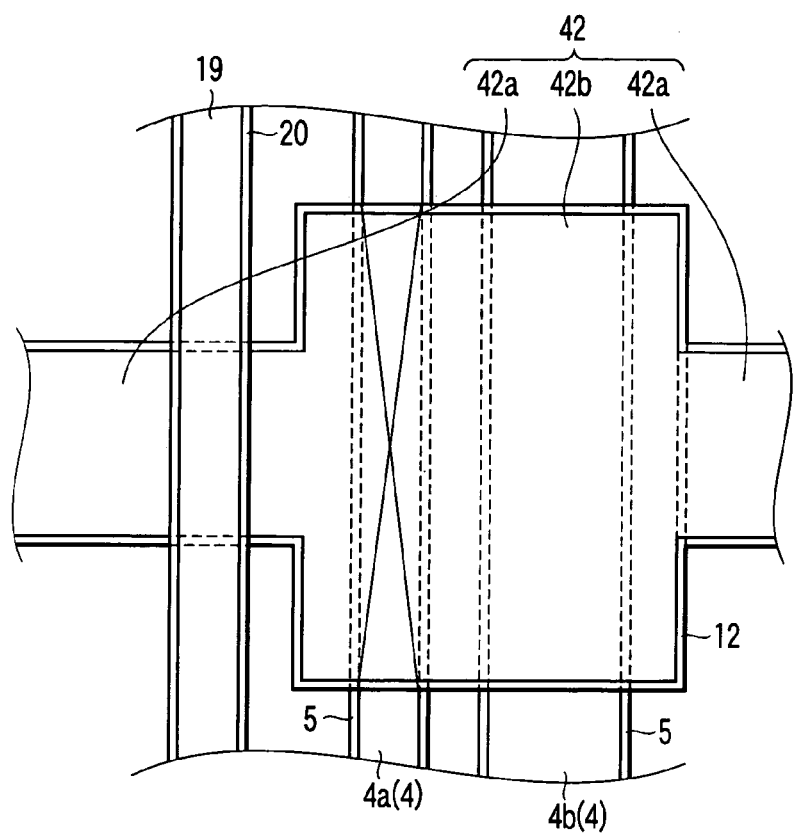
FIG. 19 is a plan view showing a semiconductor device according to the third embodiment.

A third embodiment of the present invention will next be described below with reference to FIGS. 18 and 19. FIG. 18 is a cross-sectional view showing a semiconductor device according to the third embodiment. FIG. 19 is a plan view showing a semiconductor device according to the third embodiment. In the third embodiment, the same reference numerals denote the same or corresponding parts as in the above-described first and second embodiments, and the detailed description thereof will be omitted.

In the third embodiment, a plurality of lower layer conductors are formed in one layer, and at least one first conductor is extended upward of the plurality of lower layer conductors and formed in an inter-level dielectric film one layer above the layer in which the lower layer conductors are formed. Hereinafter, a semiconductor device 41 according to the third embodiment will be described with reference to FIGS. 18 and 19.

As shown in FIG. 18, in the semiconductor device 41 according to the third embodiment, a Cu wiring 42 in the n-th layer serving as a first conductor is extended upward of lower layer Cu wirings 4 serving as two lower layer conductors and formed in the (n−1)-th layer. The Cu wiring 42 passes through a capping layer 8 and low-k inter-level dielectric film 7 in the n-th layer and top barrier film 6 in the (n−1)-th layer along the film thickness direction at the position where at least a part of the Cu wiring 42 overlaps a lower layer Cu wiring 4a constituting the lower layer Cu wirings 4 and having the same conductive passage as the Cu wiring 42. In the Cu wiring 42, the portion passing through the capping layer 8 and low-k inter-level dielectric film 7 in the n-th layer and top barrier film 6 in the (n−1)-th layer along the film thickness direction is referred to as a through portion 42a. The Cu wiring 42 is electrically connected to the lower layer Cu wiring 4a through the through portion 42a and barrier metal film (Ta film) 12 to serve as a part of the same conductive passage as the lower layer Cu wiring 4a.

On the other hand, in the portion above at least the lower layer Cu wiring 4b constituting the lower layer Cu wirings 4 and being not electrically connected to the Cu wiring 42, the Cu wiring 42 does not pass through the low-k inter-level dielectric film 7 in the n-th layer and top barrier film 6 in the (n−1)-th layer along the film thickness direction. In the Cu wiring 42, the portion that does not pass through the low-k inter-level dielectric film 7 in the n-th layer and top barrier film 6 in the (n−1)-th layer along the film thickness direction is referred to as a non-through portion 42b. As shown in FIG. 19, the width (line width) of at least a part of the Cu wiring 42 in the through portion 42a in which the wiring cross-section has been extended along the film thickness direction is reduced relative to the Cu wiring 42 in the non-through portion 42b, and the width (line width) is reduced to a small value.

As described above, the third embodiment can obtain the same advantage as the abovementioned first and second embodiments. Further, by dividing the Cu wiring 42 into the through portion 42a and non-through portion 42b depending on a setting of the conductive passage, it is possible to adequately and properly prevent the Cu wiring 42 and lower layer Cu wirings 4 from being short-circuited to each other.

Fourth Embodiment

Figure 20:
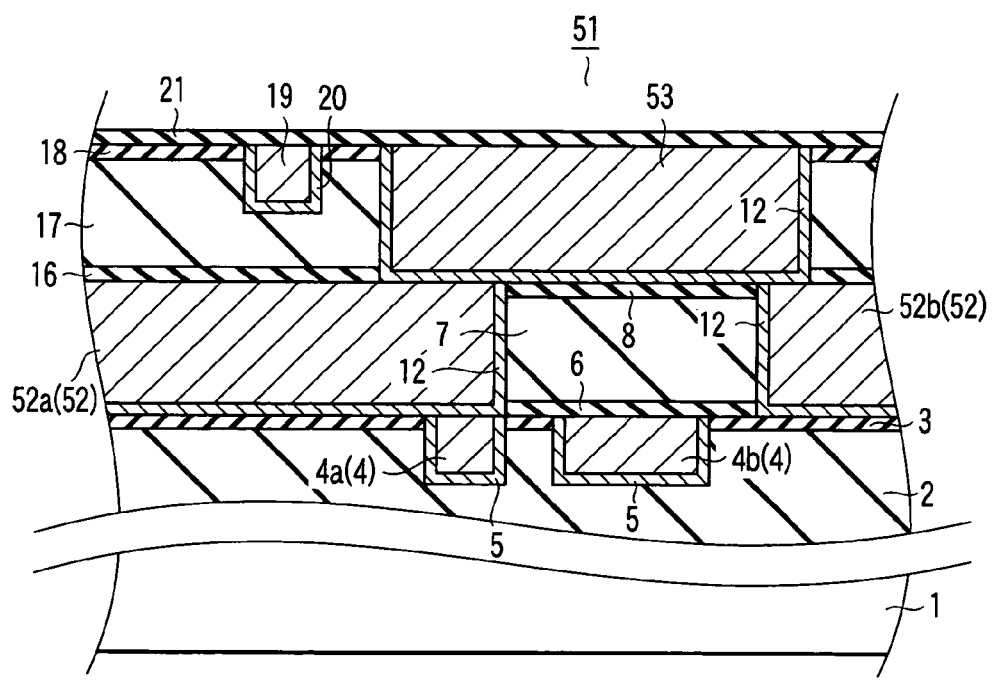
FIG. 20 is a cross-sectional view showing a semiconductor device according to a fourth embodiment.

A fourth embodiment of the present invention will next be described below with reference to FIG. 20. FIG. 20 is a cross-sectional view showing a semiconductor device according to the fourth embodiment. In the fourth embodiment, the same reference numerals denote the same or corresponding parts as in the first to third embodiments, and the detailed description thereof will be omitted.

The fourth embodiment differs from the abovementioned third embodiment in that, in the portion above at least the lower layer wiring that constitutes respective lower layer wirings and being not electrically connected to the first conductor, the first conductor is not formed in an inter-level dielectric film one layer above the layer in which the lower layer wirings are formed. In the fourth embodiment, at least one additional upper layer conductor to be electrically connected to the first conductor is formed in the inter-level dielectric film two layer above the layer in which the respective lower layer wirings are formed in order to prevent the first conductor and lower layer wirings from being short-circuited to each other. Hereinafter, a semiconductor device 51 according to the fourth embodiment will be described with reference to FIG. 20.

As shown in FIG. 20, in the semiconductor device 51 according to the fourth embodiment, in the portion above at least the lower layer Cu wiring 4b that constitutes respective lower layer Cu wirings 4 and being not electrically connected to a Cu wiring 52, the Cu wiring 52 is not formed in the low-k inter-level dielectric film 7 one layer above the layer in which respective Cu wirings 4 are formed. At the same time, at least two Cu wirings 52 having the same conductive passage are individually formed at the portions sandwiching the position overlapping the lower layer Cu wiring 4b that is not connected to the Cu wirings 52 in the low-k inter-level dielectric film 7 one layer above the layer in which the lower layer Cu wirings 4 are formed. A first current application section 52a and second current application section 52b in the Cu wiring 52 pass through the capping film 8 and low-k inter-level dielectric film 7 in the n-th layer and top barrier film 6 in the (n−1)-th layer along the film thickness direction.

Further, as shown in FIG. 20, in the semiconductor device 51 according to the fourth embodiment, an upper layer Cu wiring 53 for bypass serving as one conductor passes through a low-k inter-level dielectric film 17 two layers above the layer in which the lower layer Cu wirings 4 are formed at the position where at least a part of the Cu wiring 53 overlaps the Cu wirings 52. That is, in the low-k inter-level dielectric film 17 two layer above the layer in which the lower layer Cu wirings 4 are formed, the upper layer Cu wiring 53 for bypass formed at the position overlapping the lower layer Cu wiring 4b that is not connected to the Cu wirings 52 constitutes the same conductive passage as that of the Cu wirings 52 formed in the low-k inter-level dielectric film 7 one layer above the layer in which the lower layer Cu wirings 4 are formed and is electrically connected to the lower layer Cu wiring 4a that constitutes the lower layer Cu wiring 4 and is electrically connected to the first current application section 52a of the Cu wiring 52.

As described above, the fourth embodiment can obtain the same advantage as the abovementioned first to third embodiments.

Fifth Embodiment

Figure 21:
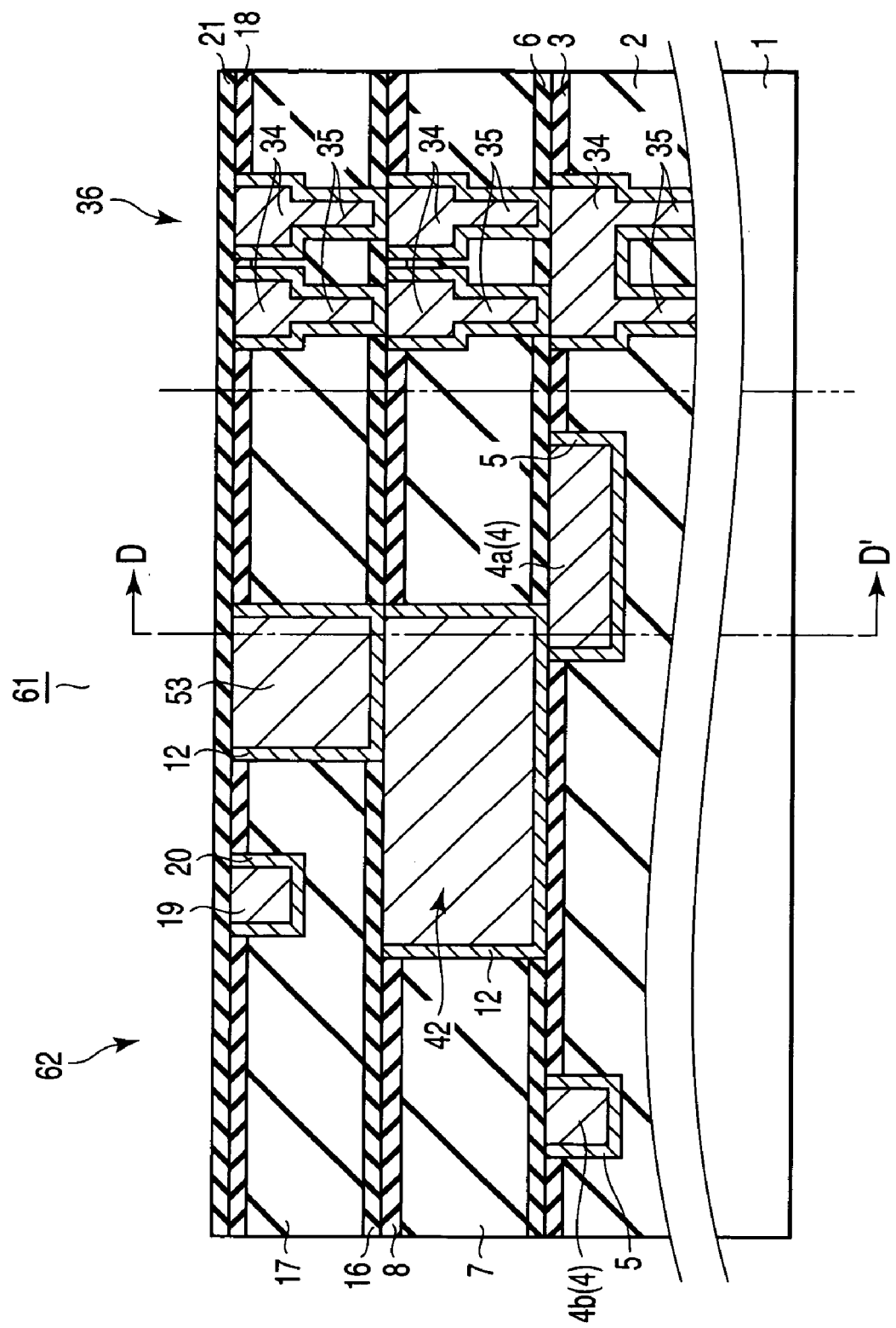
FIG. 21 is a cross-sectional view showing a semiconductor device according to a fifth embodiment.
Figure 22:
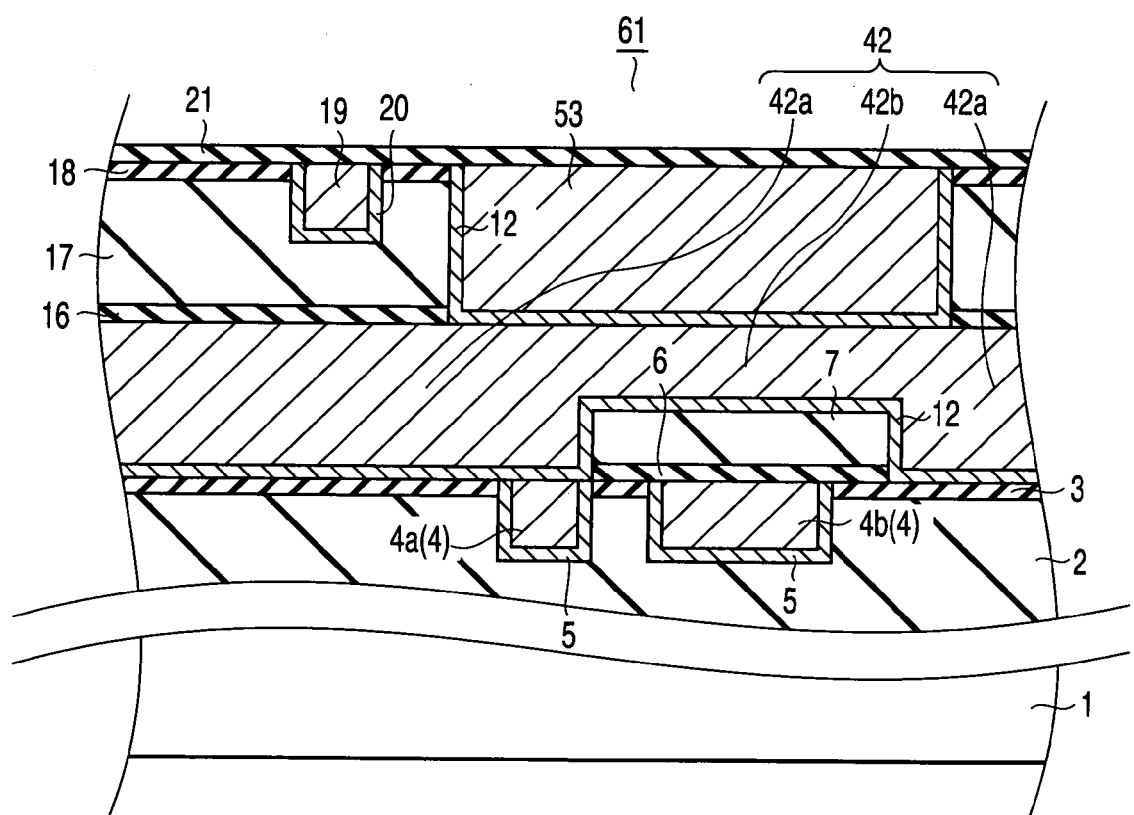
FIG. 22 is a cross-sectional view taken along the dashed line D-D' in FIG. 21.

A fifth embodiment of the present invention will next be described below with reference to FIGS. 21 and 22. FIG. 21 is a cross-sectional view showing a semiconductor device according to the fifth embodiment. FIG. 22 is a cross-sectional view taken along the dashed line D-D' in FIG. 21. In the fifth embodiment, the same reference numerals denote the same or corresponding parts as in the abovementioned first to fourth embodiments, and the detailed description thereof will be omitted.

The fifth embodiment is a combination of the abovementioned third and fourth embodiments. Hereinafter, a semiconductor device 61 according to the fifth embodiment will be described with reference to FIGS. 21 and 22.

As shown in FIG. 21, in the semiconductor device 61 according to the fifth embodiment, in an effective wiring section 62 denoted by the area on the left side of the double dashed line in FIG. 21, the lower layer Cu wiring 4a, Cu wiring 42, and upper layer Cu wiring 53 for bypass are overlapped with each other at least partly along the stacking direction of the low-k inter-level dielectric films 2, 7, and 17. The Cu wiring 42 passes through the low-k inter-level dielectric film 7 along the film thickness direction. Further, the upper layer Cu wiring 53 for bypass passes through the low-k inter-level dielectric film 7 along the film thickness direction. With the above configuration, the lower layer Cu wiring 4a, Cu wiring 42 (through portion 42a of Cu wiring 42), and upper layer Cu wiring 53 for bypass is electrically connected to each other. As a result, in the effective wiring section 62, one conductive passage constituted by the lower layer Cu wiring 4a, Cu wiring 42, and upper layer Cu wiring 53 for bypass is formed.

Further, as shown in FIG. 22, in the semiconductor device 61 according to the fifth embodiment, the upper layer Cu wiring 53 for bypass is mainly formed above the non-through portion 42b of the Cu wiring 42. The left end portion of the upper layer Cu wiring 53 for bypass is extended above the portion at which the lower layer Cu wiring 4a and through portion 42a of the Cu wiring 42 are overlapped with each other. At the same time, the right end portion of the upper layer Cu wiring 53 for bypass is extended above the through portion 42a of the Cu wiring 42. The through portion 42a of the Cu wiring that the light and right end portions of the upper layer Cu wiring 53 for bypass overlap corresponds to the first and second current application sections 52a and 52b in the abovementioned fourth embodiment.

As described above, the fifth embodiment can obtain the same advantage as the abovementioned first to fourth embodiments. Further, by forming the upper layer Cu wiring 53 for bypass above the non-through portion 42b of the Cu wiring 42 and extending it above the through portion 42a of the Cu wiring 42, it is possible to gain a wiring cross-section for the Cu wiring 42. As a result, the electrical characteristics and reliability of the semiconductor device 61 can be increased.

The semiconductor device according to the present invention is not limited to above first to fifth embodiments. The configuration or manufacturing process thereof can partly be modified or various settings can be appropriately and properly combined without departing from the sprit and scope of the present invention.

For example, the width length of the Cu broad wiring 14 which is a first conductor is not limited to the abovementioned value of about 10 μm or more. It is sufficient for the Cu broad wiring 14 to have a width length of about 1 μm or more. The width length of the Cu dummy via wiring 15 which is a second conductor is not limited to the abovementioned value of about 0.1 μm. It is sufficient for the Cu dummy via wiring 15 to have a width length of about 0.5 μm or less. Alternatively, it is sufficient for the Cu dummy via wiring 15 to have a width length not more than half the width length of the Cu broad wiring 14. The pitch between the adjacently provided Cu dummy via wirings 15 is not limited to the abovementioned value of about 0.2 μm. It is sufficient for the pitch between the Cu dummy via wirings 15 to be set to not more than double the width length of the Cu dummy via wirings 15.

When a part of each of the Cu dummy via wirings 15 used in the first embodiment is substantially connected to a reinforcing material (reinforcing film) having high mechanical strength (Young's modulus), it is possible to increase the strength against an external force in particular. In this case, the connection portion is not limited to the lower end portion or intermediate portion (halfway portion). Alternatively, each of the Cu dummy via wirings 15 may be connected to all the other reinforcing materials formed below the broad Cu wiring 14 to which the wirings 15 are connected. Further, the broad Cu wiring 14 and Cu dummy via wirings 15 may be formed as a so-called single-damascene structure in which they are individually formed. It is sufficient for the strength of the connection portions between the broad Cu wiring 14 or other reinforcing materials and Cu dummy via wirings 15 to be greater than the horizontal load stress and vertical load stress applied to the connection portions.

The reinforcing member (reinforcing film) having a Young's modulus of 30 GPa or more is not limited to the SiCN film or SiC film but any material can be used as far as it has a Young's modulus of 30 GPa or more and it does not have electrical function (conductivity). For example, the reinforcing member may be made of ceramic. More specifically, it is possible to use d-TEOS, p-$SiH_4$, $SiO_2$, SiO, SiOP, SiOF, SiN, SiON, SiCH, SIOC, SICOH, and the like. Further, in the case where the capping film (capping layer) has a Young's modulus of about 30 GPa or more and this capping film can be used as a reinforcing material (reinforcing film), it is possible to omit the top barrier film (top barrier layer) depending on a wiring material. Conversely, it is possible to omit the capping film (capping layer). That is, it is sufficient to form at least one kind (one layer) of reinforcing material. As a matter of course, a plurality of kinds (a plurality of layers, multilayer) of reinforcing materials may be formed. The number of kinds (layers) of reinforcing materials should appropriately be set in accordance with a configuration or function of a desired semiconductor device.

Examples of the low-k dielectric film having a dielectric constant of 3.4 or less include a film having a siloxane skeleton such as polysiloxane, hydrogen silsesquioxane, polymethylsiloxane, methylsilsesquioxane, a film mainly comprising organic resin such as polyarylene ether, polybenzooxazole, polybenzocyclobutene, and a porous film such as a porous silica film. The inter-level dielectric film formed using such a low-k dielectric film is not limited to a film having a single layer structure, but may be a film having a stacked structure such as a hybrid film obtained by stacking an organic low-k dielectric film and inorganic low-k dielectric film or multilayer film obtained by interposing an etching stopper dielectric film between the low-k dielectric film provided in the layer including a wiring and the low-k dielectric film provided in the layer including a via plug.

The materials of the lower layer conductor 4, first conductors 14, 32, 42, and 52, second conductor 15, and upper layer conductors 19 and 53 are not limited to copper (Cu). They may be formed of a metal film containing, as a main component, at least one metal elements selected from a group consisting of Cu, Al, W, Ta, Nb, Ti, V, Ru, Mo, or a metal stacking film obtained by combining these elements. Further, the materials of the lower layer conductor 4, first conductors 14, 32, 42, and 52, second conductor 15, and upper layer conductors 19 and 53 may differ from each other. The barrier metal film is not limited to the Ta film. For example, the barrier metal film may be a stacked film consisting of a combination of Ta and TaN, Ti and TiN, Nb and NbN, W and WN, or Zr and ZrN. Further, the barrier metal film may be a single layered film selected from these metals, or compounds thereof a TaSiN film or TiSiN film. The compound layer may be made of a nitride, as well as carbide mainly comprising one selected from the above metals or a boride. That is, the barrier metal layer should be made of the material capable of increasing endurance against the horizontal load stress and vertical load stress of the effective wiring section and reinforcing capability of the reinforcing wiring section depending on materials of the first conductors 14, 32, 42, and 52, and second conductor 15.

Examples of such a material of the barrier metal film include Group IV-A metal, Group V-A metal, Group VI-A metal or compounds thereof.

As a matter of course, it is preferable that the materials of the reinforcing material, low-k dielectric film, wiring and barrier metal film be combined in a mutually reinforcing way in order to increase capability thereof.

The shapes of the effective wiring sections and wiring patterns of the reinforcing wiring sections in the first to fifth embodiments are not limited to those shown in FIGS. 12, 13, 16, 17, and 18 to 22. For example, each of the Cu dummy via wirings 15 shown in FIG. 12 may be formed in a shape that goes into the inside of the low-k inter-level dielectric film 2 in the (n−1)-th layer. Further, only the d-TEOS film 3 may be provided adjacent to the low-k inter-level dielectric film 2 as a dielectric film. Even with the above configuration, it is possible to sufficiently obtain effects of the present invention. Further, the mechanical reinforcement section 36 as shown in FIG. 16 may be formed in the semiconductor devices 22, 41, 51, and 61 according to the first and third to fifth embodiments. In this case, mechanical strength of these semiconductor devices can be increased as in the case of the semiconductor device 31 according to the second embodiment.

The number of layers of the low-k inter-level dielectric films 2, 7, and 17, the lower layer conductor 4, the first conductors 14, 32, 42, and 52, and the upper layer conductor 19 and 53 is not limited to two or three, but may be four or more.

Further, it is possible to use a film other than the d-TEOS film as the capping film 3. Similarly, in place of the SiCN film, an SiN film can be used as the top barrier film 6. It is sufficient for a film to be used as the capping film 3 and top barrier film 6 to have a Young's modulus of about 30 GPa or more.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of inter-level dielectric films which are stacked and provided in plural layers above a substrate;
   at least one first conductor which is provided in at least one inter-level dielectric film of the stacked inter-level dielectric films; and
   a plurality of second conductors which are provided in the inter-level dielectric film in which the first conductor is provided and which are connected to the lower surface of the first conductor and which are extended along the downward direction from the first conductor and further extended along a first direction and a second direction perpendicular to the first direction in such a manner as to be spaced apart from each other to form a lattice shape, wherein the second conductors are formed passing through the inter-level dielectric film in which the first conductor is provided along the film thickness direction thereof at the position off the position above the lower layer conductor.

2. The semiconductor device according to claim 1, wherein the lower layer conductor is electrically unconnected to the first conductor and the second conductors and is provided at a position overlapped at least partly with the first conductor in an inter-level dielectric film below the inter-level dielectric film in which the first conductor and the second conductors are provided.

3. The semiconductor device according to claim 2, further comprising:
   at least one another dielectric film which has a Young's modulus of 30 GPa or more and which is provided between the inter-level dielectric film in which the first conductor and second conductors are provided and the inter-level dielectric film in which the lower layer conductor is provided,
   the second conductors being provided with reaching the another dielectric film at least partly.

4. The semiconductor device according to claim 2, wherein
   the lower layer conductor is a part of a conductive passage, and
   the second conductors are dummy wirings to which a current is not actually supplied.

5. The semiconductor device according to claim 1, wherein
   the second conductors are extended along the longitudinal direction of the first conductor and along the width direction perpendicular to the longitudinal direction in such a manner as to be spaced apart from each other to form a lattice shape.

6. The semiconductor device according to claim 1, wherein
   a pitch between the adjacently provided second conductors is not more than double the width of each of the second conductors.

7. The semiconductor device according to claim 1, wherein
   the width of the first conductor is 1 µm or more.

8. The semiconductor device according to claim 1, wherein
   the width of each of the second conductors is not more than half that of the first conductor.

9. The semiconductor device according to claim 1, wherein
   the width of each of the second conductors is 0.5 µm or less.

10. The semiconductor device according to claim 1, wherein
    the second conductors are provided such that the coverage of the lower surface of the first conductor by the second conductors becomes 10% or more.

11. The semiconductor device according to claim 1, wherein
    each of the inter-level dielectric films is a low-k inter-level dielectric film having a relative dielectric constant of 3.4 or less.

12. A semiconductor device comprising:
    a plurality of inter-level dielectric films which are stacked and provided in plural layers above a substrate;
    at least one lower layer conductor which is provided as a part of a conductive passage in at least one lower inter-level dielectric film of the stacked inter-level dielectric films; and
    at least one first conductor which is provided at the position above and substantially overlapping the lower layer conductor and the lower inter-level dielectric film in which the lower layer conductor is provided in such a manner as to pass through an inter-level dielectric film above the lower inter-level dielectric film in which the lower layer conductor is provided along the film thickness direction thereof and which is electrically connected to the lower layer conductor to serve as a part of the conductive passage.

13. The semiconductor device according to claim 12, wherein
each of the inter-level dielectric films is a low-k inter-level dielectric film having a relative dielectric constant of 3.4 or less.

14. The semiconductor device according to claim 12, further comprising:
at least one another dielectric film which has a Young's modulus of 30 GPa or more and which is provided between the lower inter-level dielectric film in which the lower layer conductor is provided and the inter-level dielectric film above the lower inter-level dielectric film in which the first conductor is provided,
the first conductor being provided with reaching the another dielectric film at least partly.

15. A semiconductor device comprising:
a plurality of inter-level dielectric films which are stacked and provided in plural layers above a substrate;
at least one lower layer conductor which is provided in at least one lower inter-level dielectric film of the stacked inter-level dielectric films; and
at least one first conductor which is electrically unconnected to the lower layer conductor and which is provided in an inter-level dielectric film above the lower inter-level dielectric film in which the lower layer conductor is provided at the position above the lower layer conductor and overlapping the lower layer conductor partly, at least a part of the first conductor having a smaller line width at the position off the area above the lower layer conductor and, at this position, passing through the inter-level dielectric film above the lower inter-level dielectric film in which the lower layer conductor is provided along the film thickness direction thereof.

16. The semiconductor device according to claim 15, wherein
each of the inter-level dielectric films is a low-k inter-level dielectric film having a relative dielectric constant of 3.4 or less.

17. The semiconductor device according to claim 15, further comprising:
at least one another dielectric film which has a Young's modulus of 30 GPa or more and which is provided between the lower inter-level dielectric film in which the lower layer conductor is provided and the inter-level dielectric film above the lower inter-level dielectric film in which the first conductor is provided,
the first conductor being provided with reaching the another dielectric film at least partly.

18. A semiconductor device comprising:
a plurality of inter-level dielectric films which are stacked and provided in plural layers above a substrate;
at least one lower layer conductor which is provided in at least one lower inter-level dielectric film of the stacked inter-level dielectric films;
at least one first conductor which is electrically unconnected to the lower layer conductor and which has first and second current application portions provided in such a manner as to pass through a middle inter-level dielectric film above the lower inter-level dielectric film in which the lower layer conductor is provided along the film thickness direction thereof and sandwich the position above and overlapping the lower layer conductor, the first and second current application portions being electrically connected to each other to serve as a part of a conductive passage; and
at least one upper layer conductor which is provided in such a manner as to pass through an inter-level dielectric film above the middle inter-level dielectric film in which the first and second current application portions of the first conductor are provided along the film thickness direction thereof at the position above and overlapping the lower layer conductor and which is electrically connected to the first and second current application portions of the first conductor to serve as a part of the conductive passage.

19. The semiconductor device according to claim 18, wherein
each of the inter-level dielectric films is a low-k inter-level dielectric film having a relative dielectric constant of 3.4 or less.

20. The semiconductor device according to claim 18, further comprising:
at least two another dielectric films which have a Young's modulus of 30 GPa or more and which is provided between the inter-level dielectric film in which the lower layer conductor is provided and the inter-level dielectric film in which the first conductor is provided and between the inter-level dielectric film in which the first conductor is provided and the inter-level dielectric film in which the upper layer conductor is provided,
each of the first conductor and upper layer conductor being provided with reaching the another dielectric film below the inter-level dielectric film in which each conductor is provided respectively at least partly.

* * * * *